(12) United States Patent
Kuroda et al.

(10) Patent No.: US 9,123,554 B2
(45) Date of Patent: Sep. 1, 2015

(54) SEMICONDUCTOR DEVICE

(71) Applicant: Renesas Electronics Corporation, Kawasaki-shi, Kanagawa (JP)

(72) Inventors: Atsushi Kuroda, Kanagawa (JP); Takafumi Betsui, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 72 days.

(21) Appl. No.: 14/037,620

(22) Filed: Sep. 26, 2013

(65) Prior Publication Data

US 2014/0097547 A1    Apr. 10, 2014

(30) Foreign Application Priority Data

Sep. 28, 2012   (JP) .................................. 2012-215860

(51) Int. Cl.
*H01L 23/48*      (2006.01)
*H01L 23/52*      (2006.01)
*H01L 25/065*     (2006.01)
*H01L 23/00*      (2006.01)

(52) U.S. Cl.
CPC ............ *H01L 25/0657* (2013.01); *H01L 24/09* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2924/15311* (2013.01)

(58) Field of Classification Search
CPC ............................ H01L 25/0657; H01L 24/09
USPC .................................. 257/777, 621; 438/110
See application file for complete search history.

(56) References Cited

U.S. PATENT DOCUMENTS

| | | | |
|---|---|---|---|
| 6,812,565 B2 * | 11/2004 | Nishimoto et al. | ........... 257/723 |
| 7,323,773 B2 | 1/2008 | Hayashi et al. | |
| 7,745,915 B2 | 6/2010 | Suwa et al. | |
| 8,383,456 B2 * | 2/2013 | Okada et al. | .................. 438/108 |

FOREIGN PATENT DOCUMENTS

| | | |
|---|---|---|
| JP | 2006-093189 A | 4/2006 |
| JP | 2006-237385 A | 9/2006 |

* cited by examiner

*Primary Examiner* — Theresa T Doan
(74) *Attorney, Agent, or Firm* — Miles & Stockbridge P.C.

(57) ABSTRACT

This invention is to improve noise immunity to the power supply and ground of a wiring board and a second semiconductor chip in an interior of a semiconductor device. A first semiconductor chip is mounted over a wiring board, and a second semiconductor chip is mounted in a central part located over the first semiconductor chip. Bottom surface electrodes of power and ground systems in the second semiconductor chip are led to their corresponding external coupling electrodes formed in the central part of the wiring board though chip through vias formed in the central part of the first semiconductor chip. The power and ground system bottom surface electrodes, the through vias and the external coupling electrodes are respectively arranged discretely from each other between the power and ground systems.

20 Claims, 12 Drawing Sheets

SEMICONDUCTOR DEVICE

CROSS-REFERENCE TO RELATED APPLICATIONS

The disclosure of Japanese Patent Application No. 2012-215860 filed on Sep. 28, 2012 including the specification, drawings and abstract is incorporated herein by reference in its entirety.

BACKGROUND

The present invention relates to a layout of external coupling electrodes related to power and ground systems of a wiring board and semiconductor chips in a semiconductor device in which a plurality of the semiconductor chips are mounted over the wiring board in piles, and to, for example, a technology effective if applied to a data processing device or the like a SiP (System in Package) with a microcomputer chip and its peripheral chips or the like mounted in a package.

A data processing device called SiP has been described in, for example, a Patent Document 1. In the SiP described in the same document, a microcomputer chip is surface-mounted over the surface of a buildup type wiring board formed with bottom surface solder balls, and a synchronous DRAM (Dynamic Random Access Memory) chip is provided over the microcomputer chip. The back surface of the synchronous DRAM chip is fixedly stuck to the surface of the microcomputer chip. Electrode pads exposed to the surface of the synchronous DRAM chip are coupled by wire bonding to prescribed electrodes provided in outer peripheral edges at the surface of the wiring board. Paths coupled by wire bonding are configured as paths of an address, a command, data and a strobe signal used to gain access to the synchronous DRAM chip by the microcomputer chip and are used as power supply paths of power and ground systems.

The quality of signals in the SiP has been described in, for example, a Patent Document 2. In the same document, there has been described a devise for maintaining signal quality over wirings in a wiring board for coupling a plurality of semiconductor chips within the SiP. It has been described in the documents that, for example, power and ground planes are adopted within the wiring board to stabilize power and ground systems, and external power supply terminals and external ground terminals of the wiring board are made adjacent to each other.

RELATED ART DOCUMENTS

Patent Document

[Patent Document 1] Japanese Unexamined Patent Publication No. 2006-093189
[Patent Document 2] Japanese Unexamined Patent Publication No. 2006-237385

SUMMARY

The present inventors had discussions about the relationship between an electrode layout of a semiconductor chip employed in a semiconductor device of an SIP configuration and an electrode layout of a wiring board employed therein. As described in the Patent Document 1, when both of wire bonding pads of the synchronous DRAM chip and wire bonding pads at the surface of the wiring board, which are coupled thereto, are placed at their corresponding outer peripheral edges, it is relatively easy to achieve the minimization of each path. When, however, the external terminals of the synchronous DRAM chip are placed in an array form at its bottom surface, wire routing in the wiring board becomes long in such a configuration that such external terminals are led out outwardly of the outer peripheral edges of the wiring board, thus increasing impedance. This leads to an increase in nose. Externally attaching bypass capacitors to the power and ground systems and stabilizing their stabilization in particular have generally been performed. Therefore, even if the external terminals of the wiring board have been formed in a BGA (Ball Grid Array) configuration, bump electrodes related to the power and ground systems have been assigned to their corresponding outer peripheral edge portions. This will cause an increase in the instability of the power and ground systems. As in the Patent Document 2, only the mere adjacent layout of the power supply terminals and ground terminals at this time is not enough.

The above, other objects and novel features of the present invention will become apparent from the description of the present specification and the accompanying drawings.

A summary of a typical one of embodiments disclosed in the present application will be explained in brief as follows:

A first semiconductor chip is mounted over a wiring board, and a second semiconductor chip is mounted in a central part located over the first semiconductor chip. Bottom surface electrodes of power and ground systems in the second semiconductor chip are led to their corresponding external coupling electrodes formed in the central part of the wiring board through chip through vias formed in the central part of the first semiconductor chip. The bottom surface electrodes, through vias and external coupling electrodes for the power and ground systems are respectively arranged so as to pair up in a required combination based on one unit or plural units of the power and ground systems.

Advantageous effects obtained by a typical one of embodiments disclosed in the present application will be briefly explained as follows:

It is possible to improve noise immunity to power supplies and ground of a wiring board and a second semiconductor chip inside a semiconductor device.

DETAILED DESCRIPTION

1. Summary of the Embodiments

Figure 1:
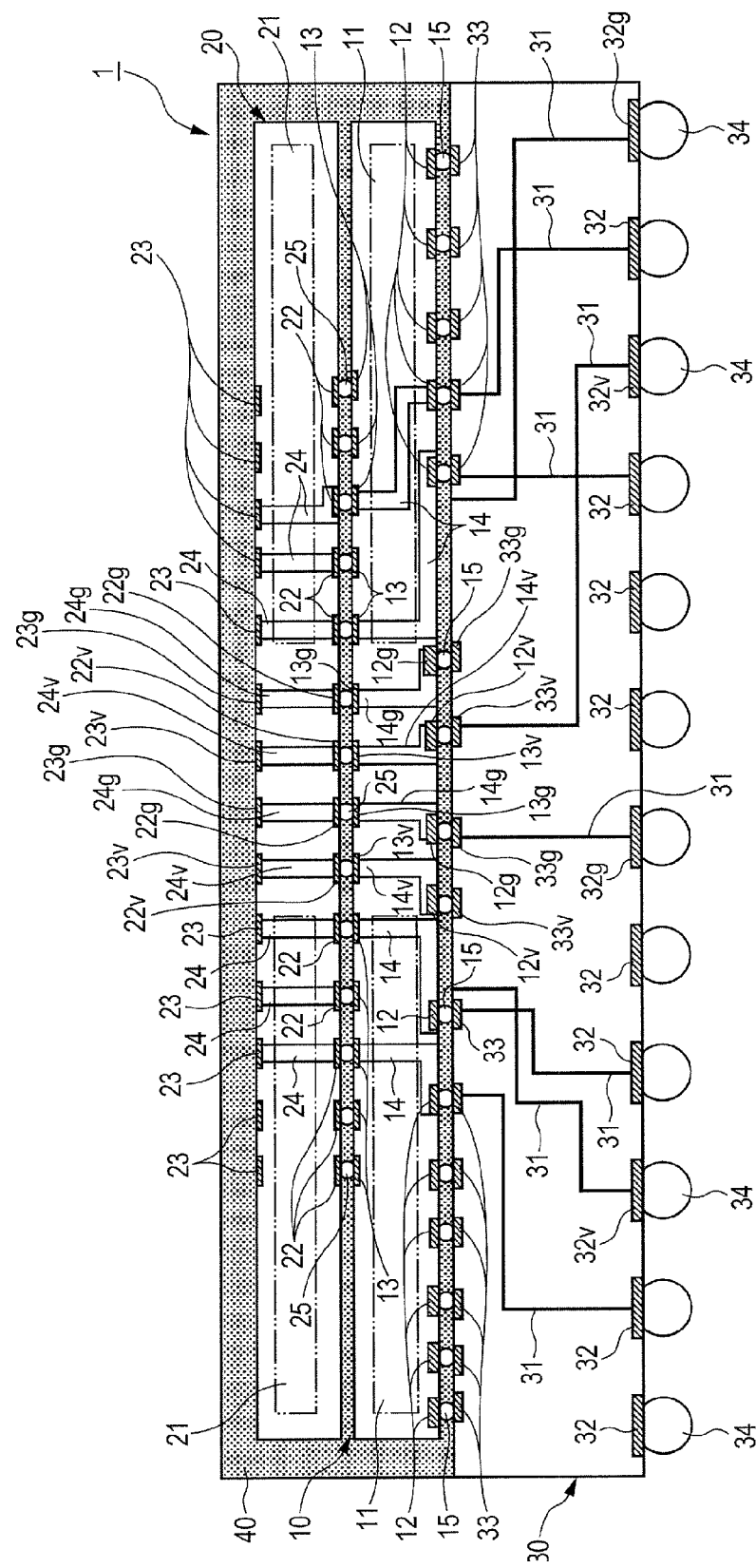
FIG. 1 is a sectional view illustrating a schematic vertical sectional structure of a semiconductor device according to a first embodiment.

A summary of typical embodiments disclosed in the present application will first be explained. Reference numerals of the accompanying drawings referred to with parentheses in the description of the summary of the typical embodiments only illustrate elements included in the concept of components to which the reference numerals are given.

[1]<Ground/Ground Silicon Through Vias of First and Second Chips are Arranged in a Substrate Central Part in Such a Manner that Capacitive Coupling and Inductive Coupling Become Strong Each Other>

As illustrated in FIG. 1, a semiconductor device (1) according to a typical embodiment has a wiring board (30), a first semiconductor chip (10) mounted over the wiring board, and a second semiconductor chip (20) mounted in a central part located over the first semiconductor chip.

(a) The wiring board has a plurality of external coupling electrodes (32, 32v and 32g) disposed in an array form at a bottom surface thereof, a plurality of substrate electrodes (33, 33v and 33g) disposed in an array form at a top surface of the wiring board in pitches smaller than those of the external coupling electrodes, and in-substrate wirings (31) for coupling the external coupling electrodes and the substrate electrodes to one another respectively.

(b) The first semiconductor chip has first internal circuits (11) integrated by a semiconductor integrated circuit technology, a plurality of first chip bottom surface electrodes (12, 12v and 12g) which are coupled to their corresponding substrate electrodes and coupled to required circuit nodes of the first internal circuits respectively and which are disposed in an array form at a bottom surface of the first semiconductor chip, and a plurality of first chip top surface electrodes (13, 13v and 13g) coupled to the required circuit nodes of the first internal circuits respectively and disposed in an array form at a top surface of the first semiconductor chip.

(c) The second semiconductor chip has second internal circuits (21) integrated by a semiconductor integrated circuit technology, a plurality of second chip bottom surface electrodes (22, 22v and 22g) which are coupled to their corresponding first chip top surface electrodes and coupled to required circuit nodes of the second internal circuits respectively and which are arranged in an array form at a bottom surface of the second semiconductor chip, and a plurality of second chip top surface electrodes (23, 23v and 23g) coupled to the required circuit nodes of the second internal circuits and arranged in an array form at a top surface of the second semiconductor chip.

(d) The corresponding electrodes (22 and 23) related to signals and the corresponding electrodes (22v, 23v, 22g and 23g) related to power and ground systems in the second chip bottom surface electrodes and the second chip top surface electrodes are coupled through second silicon through vias (24, 24v and 24g). The second silicon through vias for the power system and the second silicon through vias for the ground system are arranged so as to pair up in a required combination based on one unit or plural units.

(e) The corresponding electrodes (12 and 13) related to signals, coupled to the second silicon through vias and the electrodes (12v, 12g, 13v and 13g) for power and ground systems are provided within the first chip bottom surface electrodes and the first chip top surface electrodes. The electrodes (12v, 12g, 13v and 13g) for the power and ground systems are gathered in the central part of the first semiconductor chip. The first chip bottom surface electrodes (12, 12v and 12g) for the power and ground systems and the first chip top surface electrodes (13, 13v and 13g) corresponding thereto are coupled through first silicon through vias (14, 14v and 14g). Coupling paths (12v, 13v, 14v, 12g, 13g and 14g) for the power and ground systems in these are gathered in the central part. The power system first silicon through vias and the ground system first silicon through vias are arranged so as to pair up in a required combination based on one unit or plural units.

(f) The electrodes (32, 32v, 32g, 33, 33v and 33g) coupled to the first silicon through vias are provided within the external coupling electrodes and the substrate electrodes. Of these, the electrodes (32v, 33v, 32g and 33g) for the power and ground systems are gathered in the central part of the wiring board. The power system electrodes (32v and 33v) and the ground system electrodes (32g and 33g) both gathered in the central part are arranged so as to pair up in a required combination based on one unit or plural units.

According to this, the second chip bottom surface electrodes related to the power and ground systems of the second semiconductor chip are led to their corresponding external coupling electrodes formed in the central part of the wiring board through the first silicon through vias formed in the central part of the first semiconductor chip. Thus, the wiring paths for the power and ground systems of the second semiconductor chip lying inside the semiconductor device can be made conducive to low impedance of the power and ground systems of the second semiconductor chip without the need for routing of them to the outer peripheral portion of the wiring board. Further, the second silicon through vias for the power and ground systems of the second semiconductor chip, the first silicon through vias of the first semiconductor chip, which are coupled to the second silicon through vias, and the external coupling electrodes of the wiring board, which are coupled to the first silicon through vias are arranged in such a manner as to be strong in capacitive coupling and inductive coupling by paring up with each other in a required combination based on one unit or plural units between the power and ground systems. Accordingly, the coupling between the power supply and ground to the second semiconductor chip becomes strong. With those, it is possible to improve noise immunity to the power supplies and ground of the second semiconductor chip in the semiconductor device in which the second semiconductor chip is laminated over the first semiconductor chip and mounted over one wiring board. This enables elimination of the need for external bypass capacitors. Furthermore, in the second semiconductor chip, the second chip top surface electrodes and second chip bottom surface electrodes of the power and ground systems are caused to penetrate by the second silicon through vias. It is therefore possible to improve noise immunity to the power supply and ground similarly even if the second semiconductor chip is arranged to be laminated in plural stages.

[2]<Having Plural Second Semiconductor Chips Laminated in Plural Stages>

In the semiconductor device described in the paragraph [1], the second semiconductor chip is arranged to be laminated in plural stages. The second chip top surface electrodes in the laminated lower second semiconductor chip, and the second chip bottom surface electrodes in the laminated upper second semiconductor chip are respectively coupled to one another.

According to this, the upper part of the first semiconductor chip can efficiently be utilized in the vertical direction. In the second semiconductor chip as described in the paragraph [1], the second chip top surface electrodes and second chip bottom surface electrodes for the power and ground systems are caused to penetrate by the second silicon through vias. Therefore, even if the second semiconductor chips are laminated on each other in plural stages, the effect of improving noise immunity to the power supply and ground is assured.

[3]<Power and Ground System Electrodes Classified for Data System, Command/Address System and Others of Second Semiconductor Chip>

In the semiconductor device described in the paragraph [1], the second semiconductor chip has an elongated electrode layout area. The second internal circuit has a data input/output system circuit, a command/address system input circuit and other circuits. The electrodes of the power and ground systems, which are coupled through the second silicon through vias, are classified into three types. The first type includes data system power and ground electrodes (VDDQbmp and VSSbmp) for supplying power and ground to the data input/output system circuit. The second type includes command/address system power and ground electrodes (VDD2bmp and VSSbmp) for supplying power and ground to the command/address system input circuit. The third type includes other circuit system power and ground electrodes (VDD1bmp and VSSbmp) for supplying power and ground to the other circuits. The data system power and ground electrodes are arranged along one of the long sides of the electrode layout area. The command/address system power and ground electrodes are arranged along the other of the long sides of the electrode layout area. The other circuit system power and ground electrodes are arranged along the short sides at both ends of the long sides of the electrode layout area.

According to this, the power and ground system electrodes are placed in the data input/output system electrodes, the command/address system input electrodes and other electrodes in a roughly-divided form. It is therefore possible to improve noise immunity to the power supply and ground in the roughly-divided electrode units.

[4]<First Chip in which Second Semiconductor Chips of Up to Four are Respectively Couplable in a Line Symmetric Form in X and Y Directions>

In the semiconductor device described in the paragraph [3], the first semiconductor chip has four sets of the first chip top surface electrodes (CHNL0 through CHNL3) in such a manner that four electrode layout areas are couplable in matrix form within the same plane in a line symmetric array with respect to longitudinal and transverse directions thereof. The four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

According to this, the layout areas of the data system power and ground electrodes for supplying power and ground to the data input/output system circuit of the second semiconductor chip are gathered along the longitudinal direction of the second semiconductor chip centering on its transverse direction, thereby making it possible to suppress the effects on the other power supplies and ground and signals. Thus, the data system power and ground electrodes for supplying power and ground to the command/address system input circuit enable a further improvement in noise immunity to the power supply and ground of the data input/output system circuit.

[5]<Second Semiconductor Chip: Synchronous DRAM>

In the semiconductor device described in the paragraph [4], the second semiconductor chip is a synchronous DRAM having data input/output terminals of 512 bits as the data input/output system electrodes in the second chip bottom surface electrodes and the second chip top surface electrodes.

According to this, it is possible to prevent malfunctions due to power and ground system noise of a synchronous DRAM large in the number of input/output data bits.

[6]<First Semiconductor Chip: Microcomputer>

In the semiconductor device described in the paragraph [5], the first semiconductor chip is a microcomputer including a central processing unit and a memory controller which performs memory interface control on the synchronous DRAM.

According to this, it can contribute to an improvement in reliability with respect to the operation of data processing of the microcomputer that uses as a data storage area, a synchronous DRAM in which power and ground system noise have been suppressed.

[7]<Power and Ground Electrodes of First and Second Chips are Placed in Substrate Central Part Such that Capacitive Coupling and Inductive Coupling Become Large>

A semiconductor device according to another embodiment has a wiring board, a first semiconductor chip mounted over the wiring board, and a second semiconductor chip mounted in a central part located over the first semiconductor chip. A principal point of difference in viewpoint between the present semiconductor device and the semiconductor device described in the paragraph [1] resides in that layout targets in which the capacitive coupling and the inductive coupling for the power supplies and ground in the first semiconductor chip and the second semiconductor chip become large, are changed from silicon through vias to electrodes themselves.

(a) The wiring board has a plurality of external coupling electrodes disposed in an array form at a bottom surface of the wiring board, a plurality of substrate electrodes disposed in an array form at a top surface of the wiring board in pitches smaller than those of the external coupling electrodes, and in-substrate wirings for coupling the external coupling electrodes and the substrate electrodes to one another respectively.

(b) The first semiconductor chip has first internal circuits integrated by a semiconductor integrated circuit technology, a plurality of first chip bottom surface electrodes which are coupled to their corresponding substrate electrodes and coupled to required circuit nodes of the first internal circuits respectively and which are disposed in an array form at a bottom surface of the first semiconductor chip, and a plurality of first chip top surface electrodes coupled to the required circuit nodes of the first internal circuits respectively and disposed in an array form at a top surface of the first semiconductor chip.

(c) The second semiconductor chip has second internal circuits integrated by a semiconductor integrated circuit technology, a plurality of second chip bottom surface electrodes which are coupled to their corresponding first chip top surface electrodes and coupled to required circuit nodes of the second internal circuits respectively and which are arranged in an array form at a bottom surface of the second semiconductor chip, and a plurality of second chip top surface electrodes coupled to the required circuit nodes of the second internal circuits respectively and arranged in an array form at a top surface of the second semiconductor chip.

(d) The corresponding electrodes for power and ground systems in the second chip bottom surface electrodes and the second chip top surface electrodes are coupled through second silicon through vias. The power system electrodes and ground system electrodes (22*v*, 23*v*, 22*g* and 23*g*) coupled through the second silicon through vias are arranged so as to pair up in a required combination based on one unit or plural units.

(e) Within the first chip bottom surface electrodes and the first chip top surface electrodes, the power and ground system electrodes coupled to the second silicon through vias are gathered in the central part of the first semiconductor chip. The first chip bottom surface electrodes of the respective power and ground systems gathered in the central part, and the first chip top surface electrodes corresponding thereto are coupled through first silicon through vias. The power system electrodes (32*v* and 33*v*) and the ground system electrodes (32*g* and 33*g*) respectively coupled through the first silicon through vias are arranged so as to pair up in a required combination based on one unit or plural units.

(f) The electrodes related to the power and ground systems, which are coupled to the first silicon through vias, are gathered in the central part of the wiring board within the external coupling electrodes and the substrate electrodes. The power system electrodes and the ground system electrodes both gathered in the central part are arranged so as to pair up in a required combination based on one unit or plural units.

According to this, the second chip bottom surface electrodes related to the power and ground systems of the second semiconductor chip are led to their corresponding external coupling electrodes formed in the central part of the wiring board through the first chip bottom surface electrodes and the first chip top surface electrodes formed in the central part of the first semiconductor chip. Thus, the wiring paths for the power and ground systems of the second semiconductor chip lying inside the semiconductor device can be made conducive to low impedance of the power and ground systems of the second semiconductor chip without the need for routing of them to the outer peripheral portion of the wiring board. Further, the second chip bottom surface electrodes and the second chip top surface electrodes for the power and ground systems of the second semiconductor chip, the first chip bottom surface electrodes and the first chip top surface electrodes of the first semiconductor chip which are coupled to the second chip bottom and top surface electrodes, and the external coupling electrodes of the wiring board, which are coupled to the first chip bottom and top surface electrodes, are respectively arranged so as to pair up in a required combination based on one unit or plural units of the power and ground systems and configured in such a manner that the capacitive coupling and the inductive coupling become large each other.

Thus, the coupling between the power supply and ground to the second semiconductor chip becomes strong. With those, it is possible to improve noise immunity to the power supplies and ground of the second semiconductor chip in the semiconductor device in which the second semiconductor chip is laminated over the first semiconductor chip and mounted over one wiring board. This enables elimination of the need for external bypass capacitors. Furthermore, in the second semiconductor chip, the second chip top surface electrodes and second chip bottom surface electrodes of the power and ground systems are caused to penetrate by the second silicon through vias. It is therefore possible to improve noise immunity to the power supply and ground similarly even if the second semiconductor chip is arranged to be laminated in plural stages.

[8]<Having Plural Second Semiconductor Chips Laminated in Plural Stages>

In the semiconductor device described in the paragraph [7], the second semiconductor chip is arranged to be laminated in plural stages. The second chip top surface electrodes in the laminated lower second semiconductor chip, and the second chip bottom surface electrodes in the laminated upper second semiconductor chip are respectively coupled to one another.

According to this, the upper part of the first semiconductor chip can efficiently be utilized in the vertical direction. In the second semiconductor chip as described in the paragraph [1], the second chip top surface electrodes and second chip bottom surface electrodes for the power and ground systems are caused to penetrate by the second silicon through vias. Therefore, even if the second semiconductor chips are laminated on each other in plural stages, the effect of improving noise immunity to the power supply and ground is assured.

[9]<Power and Ground System Electrodes Classified for Data System, Command/Address System and Others of Second Semiconductor Chip>

In the semiconductor device described in the paragraph [8], the second semiconductor chip has an elongated electrode layout area. The second internal circuit has a data input/output system circuit, a command/address system input circuit and other circuits. The electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits. The data system power and ground electrodes are arranged along one of the long sides of the electrode layout area. The command/address system power and ground electrodes are arranged along the other of the long sides of the electrode layout area. The other circuit system power and ground electrodes are arranged along the short sides at both ends of the long sides of the electrode layout area.

According to this, the power and ground system electrodes are placed in the data input/output system circuit, the command/address system input circuit and other circuits in a roughly-divided form. It is therefore possible to improve noise immunity to the power supply and ground in the roughly-divided circuit units.

[10]<First Chip in which Second Semiconductor Chips of Up to Four are Respectively Couplable in a Line Symmetric Form in X and Y Directions>

In the semiconductor device described in the paragraph [9], the first semiconductor chip has four sets of the first chip top surface electrodes in such a manner that four electrode layout areas are couplable in matrix form within the same plane in a line symmetric array with respect to longitudinal and transverse directions thereof. The four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

According to this, the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit. It is therefore possible to further improve noise immunity to the power supply and ground of the data input/output system circuit.

[11]<Second Semiconductor Chip: Synchronous DRAM>

In the semiconductor device described in the paragraph [9], the second semiconductor chip is a synchronous DRAM having data input/output terminals of 512 bits as the data input/output system electrodes in the second chip bottom surface electrodes and the second chip top surface electrodes.

According to this, it is possible to prevent malfunctions due to power and ground system noise of a synchronous DRAM large in the number of input/output data bits.

[12]<First Semiconductor Chip: Microcomputer>

In the semiconductor device described in the paragraph [10], the first semiconductor chip is a microcomputer including a central processing unit and a memory controller which performs memory interface control on the synchronous DRAM.

According to this, it can contribute to an improvement in reliability with respect to the operation of data processing of a microcomputer that uses as a data storage area, a synchronous DRAM in which power and ground system noise have been suppressed.

[13]<Power and Ground Silicon Through Vias of First Chip to Second Chip are Arranged in Substrate Central Part Such that Capacitive Coupling and Inductive Coupling Become Large>

A semiconductor device according to a further embodiment has a wiring board, a first semiconductor chip mounted over the wiring board, and a second semiconductor chip mounted in a central part located over the first semiconductor chip. A principal difference in viewpoint between the present semiconductor device and the semiconductor device described in the paragraph [1] resides in that reference should lead to the second chip bottom surface electrodes as the power and ground system electrodes in the second semiconductor chip without referring to the second chip top surface electrodes.

(a) The wiring board has a plurality of external coupling electrodes disposed in an array form at a bottom surface of the wiring board, a plurality of substrate electrodes disposed in an array form at a top surface of the wiring board in pitches smaller than those of the external coupling electrodes, and in-substrate wirings for coupling the external coupling electrodes and the substrate electrodes to one another respectively.

(b) The first semiconductor chip has first internal circuits integrated by a semiconductor integrated circuit technology, a plurality of first chip bottom surface electrodes which are coupled to their corresponding substrate electrodes and coupled to required circuit nodes of the first internal circuits respectively and which are disposed in an array form at a bottom surface of the first semiconductor chip, and a plurality of first chip top surface electrodes coupled to the required circuit nodes of the first internal circuits respectively and disposed in an array form at a top surface of the first semiconductor chip.

(c) The second semiconductor chip has second internal circuits integrated by a semiconductor integrated circuit technology, and a plurality of second chip bottom surface electrodes which are coupled to their corresponding first chip top surface electrodes and coupled to required circuit nodes of the second internal circuits respectively and which are arranged in an array form at a bottom surface of the second semiconductor chip.

(d) The power and ground system electrodes in the second chip bottom surface electrodes are arranged so as to pair up in a required combination based on one unit or plural units.

(e) The power and ground system electrodes coupled to the power and ground system second chip bottom surface electrodes are gathered in the central part of the first semiconductor chip within the first chip bottom surface electrodes and the first chip top surface electrodes. The first chip bottom surface electrodes of the power and ground systems gathered in the central part, and the first chip top surface electrodes corresponding thereto are coupled through first silicon through vias. The first silicon through vias for the power system and the first silicon through vias for the ground system are arranged so as to pair up in a required combination based on one unit or plural units.

(f) The electrodes related to the power and ground systems, which are coupled to the first silicon through vias, are gathered in the central part of the wiring board within the external coupling electrodes and the substrate electrodes. The power system electrodes and the ground system electrodes both gathered in the central part of the wiring board are arranged so as to pair up in a required combination based on one unit or plural units.

According to this, the second chip bottom surface electrodes related to the power and ground systems of the second semiconductor chip are led to their corresponding external coupling electrodes formed in the central part of the wiring board through the first silicon through vias formed in the central part of the first semiconductor chip. Thus, the wiring paths for the power and ground systems of the second semiconductor chip lying inside the semiconductor device can be made conducive to low impedance of the power and ground systems of the second semiconductor chip without the need for routing of them to the outer peripheral portion of the wiring board. Further, the second chip bottom surface, electrodes of the power and ground systems in the second semiconductor chip, the first silicon through vias of the first semiconductor chip, coupled to the second chip bottom surface electrodes, and the external coupling electrodes of the wiring board, which are coupled to the first silicon through vias, are respectively arranged so as to pair up in, a required combination based on one unit or plural units, of the respective power and ground systems and configured in such a manner that the capacitive coupling and the inductive coupling become large each other. Thus, the coupling between the power supply and ground that lead to the second semiconductor chip becomes strong. With those, it is possible to improve noise immunity to the power supplies and ground of the second semiconductor chip in the semiconductor device in which the second semiconductor chip is laminated over the first semiconductor chip and mounted over one wiring board. This enables elimination of the need for external bypass capacitors.

[14]<Power and Ground System Electrodes Classified for Data System, Command/Address System and Others of Second Semiconductor Chip>

In the semiconductor device described in the paragraph [13], the second semiconductor chip has an elongated electrode layout area. The second internal circuit has a data input/output system circuit, a command/address system input circuit and other circuits. The electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits. The data system power and ground electrodes are arranged along one of the long sides of the electrode layout area. The command/address system power and ground electrodes are arranged along the other of the long sides of the electrode layout area. The other circuit system power and ground electrodes are arranged along the short sides at both ends of the long sides of the electrode layout area.

According to this, the power and ground system electrodes are placed in the data input/output system circuit, the command/address system input circuit and other circuits in a roughly-divided form. It is therefore possible to improve noise immunity to the power supply and ground in the roughly-divided circuit units.

[15]<First Chip in which Second Semiconductor Chips of Up to Four are Respectively Couplable in a Line Symmetric Form in X and Y Directions>

In the semiconductor device described in the paragraph [14], the first semiconductor chip has four sets of the first chip top surface electrodes in such a manner that four electrode layout areas are couplable in matrix form within the same plane in a line symmetric array with respect to longitudinal and transverse directions thereof. The four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

According to this, the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit. It is therefore possible to further improve noise immunity to the power supply and ground of, the data input/output system circuit.

[16]<Second Semiconductor Chip: Synchronous DRAM>

In the semiconductor device described in the paragraph [15], the second semiconductor chip is a synchronous DRAM having data input/output terminals of 512 bits as the data input/output system electrodes in the second chip bottom surface electrodes and the second chip top surface electrodes.

According to this, it is possible to prevent malfunctions due to power and ground system noise of a synchronous DRAM large in the number of input/output data bits.

[17]<First Semiconductor Chip: Microcomputer>

In the semiconductor device described in the paragraph [16], the first semiconductor chip is a microcomputer including a central processing unit and a memory controller which performs memory interface control on the synchronous DRAM.

According to this, it can contribute, to an improvement in reliability with respect to the operation of data processing of a microcomputer that uses as a data storage area, a synchronous DRAM in which power and ground system noise have been suppressed.

[18]<Power and Ground Electrodes of First Chip to Second Chip are Arranged in Substrate Central Part Such that Capacitive Coupling and Inductive Coupling Become Large>

A semiconductor device according to a still further embodiment has a wiring board, a first semiconductor chip mounted over the wiring board, and a second semiconductor chip having a chip area smaller than the first semiconductor chip and mounted in a central part located over the first semiconductor chip. A principal difference in viewpoint between the present semiconductor device and the semiconductor device described in the paragraph [17] resides in that discrete layout targets of power supplies and ground in the first semiconductor chip and the second semiconductor chip are changed from silicon through vias to electrodes themselves.

(a) The wiring board has a plurality of external coupling electrodes disposed in an array form at a bottom surface of the wiring board, a plurality of substrate electrodes disposed in an array form at a top surface of the wiring board in pitches smaller than those of the external coupling electrodes, and in-substrate wirings for coupling the external coupling electrodes and the substrate electrodes to one another respectively.

(b) The first semiconductor chip has first internal circuits integrated by a semiconductor integrated circuit technology, a plurality of first chip bottom surface electrodes which are coupled to their corresponding substrate electrodes and coupled to required circuit nodes of the first internal circuits respectively and which are disposed in an array form at a bottom surface of the first semiconductor chip, and a plurality of first chip top surface electrodes coupled to the required circuit nodes of the first internal circuits respectively and disposed in an array form at a top surface of the first semiconductor chip.

(c) The second semiconductor chip has second internal circuits integrated by a semiconductor integrated circuit technology, and a plurality of second chip bottom surface electrodes which are coupled to their corresponding first chip top surface electrodes and coupled to required circuit nodes of the second internal circuits respectively and which are arranged in an array form at a bottom surface of the second semiconductor chip.

(d) The power and ground system electrodes in the second chip bottom surface electrodes are arranged so as to pair up with each other in a required combination based on one unit or plural units.

(e) The power and ground system electrodes coupled to the power and ground system second chip bottom surface electrodes are gathered in the central part of the first semiconductor chip within the first chip bottom surface electrodes and the first chip top surface electrodes. The first chip bottom surface electrodes of the respective power and ground systems gathered in the central part, and the first chip top surface electrodes corresponding thereto are coupled through first silicon through vias. The power system electrodes and the ground system electrodes respectively coupled through the first silicon through vias are arranged so as to pair up with each other in a required combination based on one unit or plural units.

(f) The electrodes coupled to the first silicon through vias are gathered in the central part of the wiring board within the external coupling electrodes and the substrate electrodes. The power system electrodes and the ground system electrodes gathered in the central part are arranged so as to pair up with each other in a required combination based on one unit or plural units.

According to this, the second chip bottom surface electrodes related to the power and ground systems of the second semiconductor chip are led to their corresponding external coupling electrodes formed in the central part of the wiring board through the first chip bottom surface electrodes and the first chip top surface electrodes formed in the central part of the first semiconductor chip. Thus, the wiring paths for the power and ground systems of the second semiconductor chip lying inside the semiconductor device can be made conducive to low impedance of the power and ground systems of the second semiconductor chip without the need for routing of them to the outer peripheral portion of the wiring board. Further, the second chip bottom surface electrodes of the power and ground systems of the second semiconductor chip, the first chip bottom surface electrodes and first chip top surface electrodes of the first semiconductor chip, which are coupled to the second chip bottom surface electrodes, and the external coupling electrodes of the wiring board, which are coupled to the first chip bottom surface electrodes and the first chip top surface electrodes, are respectively arranged so as to pair up in a required combination based on one unit or plural units of the respective power and ground systems and configured in such a manner that the capacitive coupling and the inductive coupling become large each other. Thus, the coupling between the power supply and ground that lead to the second semiconductor chip becomes strong. With those, it is possible to improve noise immunity to the power supplies and ground of the second semiconductor chip in the semiconductor device in which the second semiconductor chip is laminated over the first semiconductor chip and mounted over one wiring board. This enables elimination of the need for external bypass capacitors.

[19]<Power and Ground System Electrodes Classified for Data System, Command/Address System and Others of Second Semiconductor Chip>

In the semiconductor device described in the paragraph [18], the second semiconductor chip has an elongated electrode layout area. The second internal circuit has a data input/output system circuit, a command/address system input circuit and other circuits. The electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits. The data system power and ground electrodes are arranged along one of the long sides of the electrode layout area. The command/address system power and ground electrodes are arranged along the other of the long sides of the electrode layout area. The other circuit system power and ground electrodes are arranged along the short sides at both ends of the long sides of the electrode layout area.

According to this, the power and ground system electrodes are placed in the data input/output system circuit, the command/address system input circuit and other circuits in a roughly-divided form. It is therefore possible to improve noise immunity to the power supply and ground in the roughly-divided circuit units.

[20]<First Chip in which Second Semiconductor Chips of Up to Four are Respectively Couplable in a Line Symmetric Form in X and Y Directions>

In the semiconductor device described in the paragraph [19], the first semiconductor chip has four sets of the first chip top surface electrodes in such a manner that four electrode layout areas are couplable in matrix form within the same plane in a line symmetric array with respect to longitudinal and transverse directions thereof. The four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

According to this, the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit. It is therefore possible to further improve noise immunity to the power supply and ground of the data input/output system circuit.

[21]<Second Semiconductor Chip: Synchronous DRAM>

In the semiconductor device described in the paragraph [20], the second semiconductor chip is a synchronous DRAM having data input/output terminals of 512 bits as the data input/output system electrodes in the second chip bottom surface electrodes and the second chip top surface electrodes.

According to this, it is possible to prevent malfunctions due to power and ground system noise of a synchronous DRAM large in the number of input/output data bits.

[22]<First Semiconductor Chip: Microcomputer>

In the semiconductor device described in the paragraph [21], the first semiconductor chip is a microcomputer including a central processing unit and a memory controller which performs memory interface control on the synchronous DRAM.

According to this, it can contribute to an improvement in reliability with respect to the operation of data processing of a microcomputer that uses as a data storage area, a synchronous DRAM in which power and ground system noise have been suppressed.

2. Further Detailed Description of the Embodiments

Embodiments will be explained in further detail.

First Embodiment

A schematic vertical sectional structure of a semiconductor device according to a first embodiment is illustrated in FIG. 1. The semiconductor device 1 shown in the same figure is a data processing device referred to as, for example, SiP. A first semiconductor chip 10 and a second semiconductor chip 20 located in the central part over the first semiconductor chip are sequentially mounted over a wiring board 30, and the entirety is sealed with a resin 40.

The wiring board 30 is placed as, for example, an interposer substrate for mounting the first semiconductor chip 10 and the second semiconductor chip 20 over a system board or a motherboard (not shown). The wiring board 30 is comprised of a buildup substrate or the like formed with a plurality of wiring layers via insulating layers respectively.

A plurality of external coupling electrodes 32, 32v and 32g are disposed in an array form at the bottom surface (also described as a lower surface) of the wiring board 30. The external coupling electrodes 32, 32v and 32g are configured so as to expose some of the wiring layers from a solder resist that covers the wiring layer of the lowermost surface layer of the wiring board, for example. The external coupling electrodes 32, 32v and 32g are respectively comprised of, for example, a pad electrode and formed with solder balls 34 to form a BGA. The pitch of each of the external coupling electrodes 32, 32v and 32g, i.e., the pitch of the solder ball 34 is 400 μm, for example. Electrode materials for the external coupling electrodes 32, 32v and 32g and the solder balls 34 may be determined as appropriate.

A plurality of substrate electrodes 33, 33v and 33g are respectively disposed in the surface (also described as a top surface) of the wiring board 30 in an array form with a pitch smaller than the pitch of each of the external coupling electrodes 32, 32v and 32g. The substrate electrodes 33, 33v and 33g are configured so as to expose some of the wiring layer from a solder resist that covers the wiring layer of the lowermost surface layer of the wiring board, for example. The pitch of each of the substrate electrodes 33, 33v and 33g is 100 μm, for example.

In-substrate wirings 31 for coupling between the external coupling electrodes 32, 32v and 32g and their corresponding substrate electrodes 33, 33v and 33g are formed in the wiring layers of the wiring board 30. Only some thereof are shown in FIG. 1.

Although not limited in particular, the first semiconductor chip 10 is comprised of a microcomputer chip used for baseband processing of mobile communications at a portable terminal and its application processing. The second semiconductor chip 20 is comprised of a synchronous DRAM chip that configures a work memory or a buffer memory or the like used for data processing of the first semiconductor chip 10. Hereinafter, in the present specification, the first semiconductor chip 10 is also referred to as a microcomputer chip 10, and the second semiconductor chip 20 is also referred to as a synchronous DRAM chip 20.

The microcomputer chip 10 has first internal circuits 11 integrated over a monocrystalline silicon substrate by a CMOS integrated circuit manufacturing technology, for example. The first internal circuit 11 has, for example, a CPU that executes a program, an internal memory that stores a CPU's program and data therein, an accelerator that performs a cipher computation or the like, a memory controller that performs memory interface control on the synchronous DRAM chip 20, a timer and other input/output circuits, etc. In response to access indications from the CPU or the like, the memory controller generates strobe signals necessary for synchronous DRAM access and generates access timing therefor to control the operation of the synchronous DRAM chip 20.

The synchronous DRAM chip 20 has second internal circuits 21 integrated over a monocrystalline silicon substrate by the CMOS integrated circuit manufacturing technology, for example. The second internal circuit 21 has, for example, a data input/output system circuit, a command/address system input circuit and other circuits. The command/address input circuit inputs a command and an address therein in synchronization with a clock signal. The other circuit generates internal timing in response to the input command, decodes the input address signal in synchronization with the internal timing, selects a memory cell from a memory array using the decoded signal and performs reading or writing of data relative to the selected memory cell. The data input/output system circuit outputs data read from the memory array to the outside in synchronization with a data strobe signal synchronized with the clock signal and inputs data to be written into the memory array from outside.

The microcomputer chip 10 has a plurality of first chip bottom surface electrodes 12, 12v and 12g as external coupling electrodes, which are coupled to the substrate electrodes 33, 33v and 33g of the wiring board 30 and coupled to required circuit nodes of the first internal circuit 11 respectively and which are disposed in an array form at its bottom surface. For example, micro bumps 15 are used for coupling between the substrate electrodes 33, 33v and 33g and the first chip bottom surface electrodes 12, 12v and 12g. The micro bumps 15 are formed by applying nickel plating and solder plating to the surfaces of the electrodes, for example. The formed micro bumps 15 are molten by thermal treatment to thereby couple their opposite electrodes. The arrangement pitch of the micro bumps is 100 μm or so, for example.

A plurality of first chip top surface electrodes 13, 13v and 13g respectively coupled to required circuit nodes of the first internal circuit 11 are placed in an array form at the upper or top surface of the microcomputer chip 10. The arrangement pitch of the top surface electrodes is 50 μm or so, for example.

The synchronous DRAM chip 20 has as external coupling electrodes, a plurality of second chip bottom surface electrodes 22, 22v and 22g and a plurality of second chip top surface electrodes 23, 23v and 23g. The second chip bottom surface electrodes 22, 22v and 22g are coupled to their corresponding first chip top surface electrodes 13, 13v and 13g and coupled to required circuit nodes of the second internal circuit 21, and are thereby disposed in an array form at the bottom surface. For example, micro bumps 25 are used for coupling between the first chip top surface electrodes 13, 13v and 13g and the second chip bottom surface electrodes 22, 22v and 22g. The micro bumps 25 are formed as with the micro bumps 15, for example. The formed micro bumps 25 are molten by thermal treatment to thereby couple their opposite electrodes thereto. The arrangement pitch of the micro bumps is 50 μm or so, for example.

The second chip top surface electrodes 23, 23v and 23g are respectively coupled to required circuit nodes of the second internal circuit 21 and disposed in an array form at the top or upper surface. While the second chip top surface electrodes 23, 23v and 23g will be described even in a second embodiment, they are those that have taken into consideration an embodiment in which the synchronous DRAM chips 20 are mounted with being vertically superimposed on one another in plural stages.

As apparent from the configuration of the external coupling electrodes for mounting the microcomputer chip 10 and the synchronous DRAM chip 20 over the wiring board 30, bonding wires need not to be used for their coupling. This is because surface mounting is carried out using the micro bumps. Here in particular, a so-called TSV (Through-Silicon Via) technology is adopted that corresponding electrodes of the front and back surfaces of a semiconductor chip are coupled using silicon through vias. Since the synchronous DRAM chips 20 are those to mount chips of the same terminal configuration in piles in the form of a vertical stack, all signal terminals, power supply terminals and ground terminals corresponding to the second chip bottom surface electrodes 22, 22v and 22g and the second chip top surface electrodes 23, 23v and 23g are coupled to one another using their corresponding silicon through vias in principle.

The coupling of the synchronous DRAM chip 20 and the microcomputer chip 10 includes a coupling of a signal system and a coupling of power and ground systems. Since only the microcomputer chip 10 performs access to the synchronous DRAM chip 20 here, the coupling of the signal system is performed between the input and output terminals of the memory controller that performs memory interface control on the synchronous DRAM chip 20. Signals (data, command and address systems) are not coupled to the substrate electrodes because of coupling by a wiring layer of SoC. On the other hand, this is because the power and ground systems have to supply power and ground from the outside of the semiconductor device 1 through the circuit substrate 30. Accordingly, the second chip bottom surface electrodes 22, 22v and 22g and the second chip top surface electrodes 23, 23v and 23g for the signals and power and ground systems at the synchronous DRAM chip 20 are coupled by second silicon through vias 24, 24v and 24g for each corresponding electrode. Even at the microcomputer chip 10, the first chip top surface electrodes 13, 13v and 13g coupled to the second silicon through visas 24, 24v and 24g, and their corresponding first chip bottom surface electrodes 12, 12v and 12g are respectively coupled through first silicon through vias 14, 14v and 14g. The first chip bottom surface electrodes 12v and 12g are supplied with the power supplies and ground necessary for the synchronous DRAM chip 20 and the memory controller of the microcomputer chip 10 via their corresponding substrate electrodes 33v and 33g and external coupling electrodes 32v and 32g. The power supplies supplied to those are supplied in part for each of, for example, the data input/output system circuit, the command/address system input circuit and other circuits. Their configurations will be described in detail according to another embodiment.

Paths for supplying power and ground necessary for the synchronous DRAM chip 20 and the memory controller of the microcomputer chip 10 will be described in further detail.

The second silicon through vias 24, 24v and 24g that couple the corresponding electrodes 22 and 23, 22v and 23v and 22g and 23g for the signals and power and ground systems, of the second chip bottom surface electrodes and the second chip top surface electrodes in the synchronous DRAM chip 20 are arranged in such a manner that the second silicon through vias 24v for the power system and the second silicon through vias 24g for the ground system pair up with each other in a required combination based on one unit or plural units. In the present specification, the arrangement of the second silicon through vias to be paired with each other in the required combination based on one unit or plural units intends to increase capacitive coupling and inductive coupling as its result. As illustrated in FIG. 1, for example, it does not mean that the second silicon through vias 24g for the ground system are inevitably concentratedly placed next to the second silicon through vias 24v for the power system. It means that the second silicon through vias are arranged to pair with each other in the required combination based on one unit or plural units of the power supply and ground, in other words, the electrodes or the like for the power supply and ground are arranged discretely from each other.

With the relationship of placement of the synchronous DRAM chip 20 to the microcomputer chip 10, the electrodes 12v, 12g, 13v and 13g for the power and ground systems, coupled to the second silicon through vias 24v and 24g of the synchronous DRAM chip 20 are collected or gathered along the central long sides of the long arrangement area of the microcomputer chip 10. The first chip bottom surface electrodes 12v and 12g for the power and ground systems collected in the central part of the microcomputer chip 10, and their corresponding first chip top surface electrodes 13v and 13g are coupled to each other through the first silicon through vias 14v and 14g. Even in the case of the first silicon through vias 14v and 14g as with the second silicon through visas 24g and 24v, the first silicon through via 14v for the power system and the first silicon through via 14g for the ground system are arranged in such a manner that the capacitive coupling and the inductive coupling become large each other.

The external coupling electrodes 32v and 32g and substrate electrodes 33v and 33g related to the power and ground systems, which are coupled to the first silicon through vias 14v and 14g are collected in the central part of the wiring board 30 according to the arrangement of the first silicon through vias 14v and 14g. The electrodes 32v and 33v for the power system and the electrodes 32g and 33g for the ground system, which have been collected in the central part are arranged in such a manner that the capacitive coupling and the inductive coupling increase each other.

Figure 2:
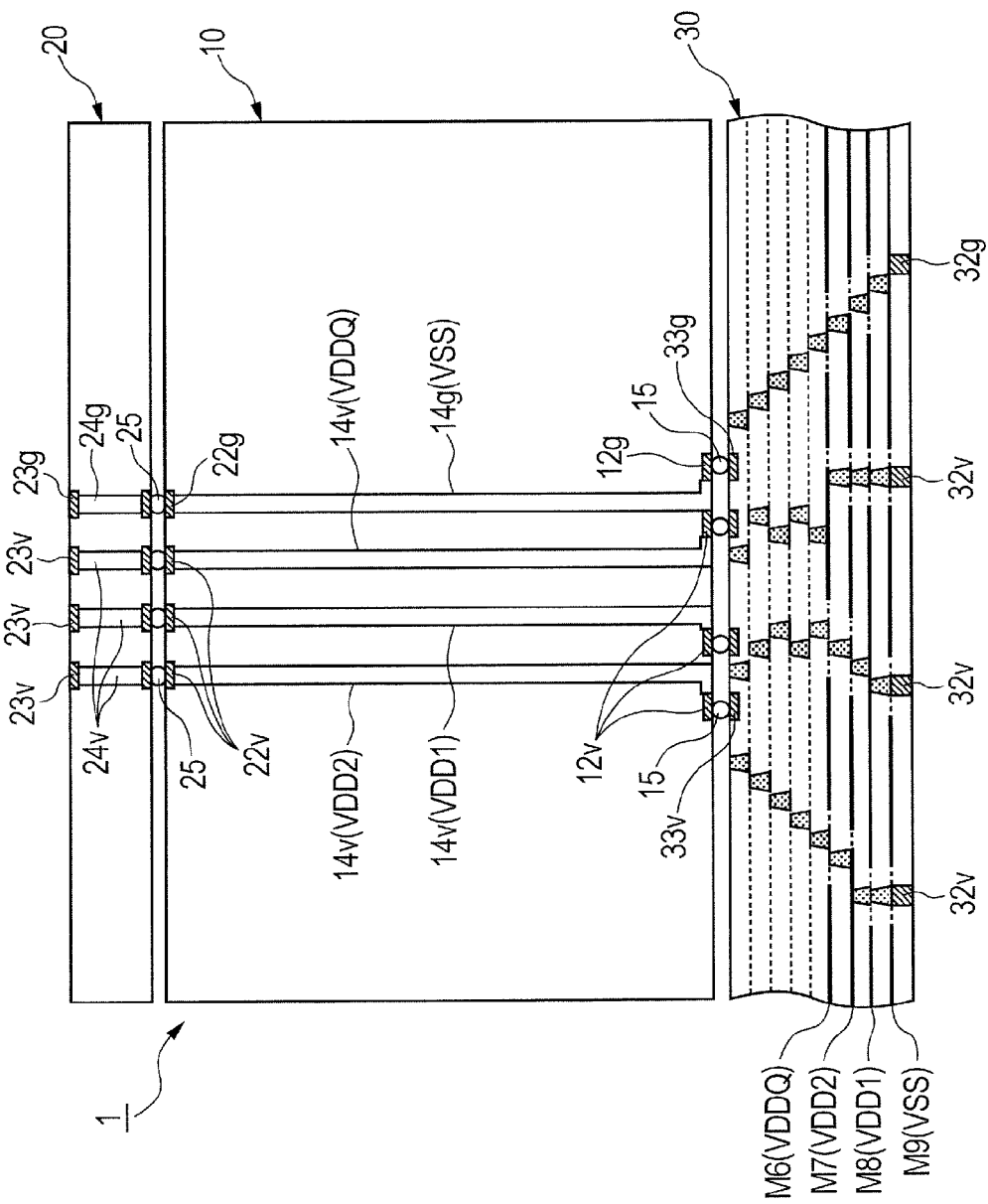
FIG. 2 is a sectional view illustrating a vertical sectional configuration in which attention is being given to supply paths of power and ground systems to a synchronous DRAM chip in the semiconductor device shown in FIG. 1.

A vertical sectional configuration in which attention is being given to supply paths of the power and ground systems to the synchronous DRAM chip 20 in the semiconductor device 1 shown in FIG. 1 is illustrated in FIG. 2. In terms of drawing plotting, respective parts are different in size from those in FIG. 1, and the mold resin and the solder balls 34 have been omitted from the figure. Here in particular, the wiring board 30 is illustrated as having wiring layers corresponding to nine layers. Each of the internal circuits 21 of the synchronous DRAM chip 20 includes a data input/output system circuit, a command/address system input circuit and other circuits as described above. A power supply for the data input/output system circuit, a power supply for the command/address system input circuit, a power supply for the other circuits and ground common to these are respectively illustrated as VDDQ, VDD2, VDD1 and VSS. The in-substrate wirings 31 shown in FIG. 1 are formed by wirings of the wiring layers and vias between the wiring layers.

According to the first embodiment, the following operative effects are brought about.

(1) The second chip bottom surface electrodes 22v and 22g related to the power and ground systems of the synchronous DRAM chip 20 are led to the external coupling electrodes 32v and 32g formed in the central part of the wiring board 30 through the first silicon through vias 14v and 14g formed in the central part of the microcomputer chip 10. Thus, the wiring paths for the power and ground systems of the synchronous DRAM chip lying inside the semiconductor device 1 can be made conducive to low impedance of the power and ground systems of the synchronous DRAM chip 20 without the need for routing of them to the outer peripheral portion of the wiring board 30.

(2) Further, the through vias and electrodes are arranged in such a manner that the capacitive coupling and the inductive coupling become large each other between the power and ground systems. First, they are the second silicon through vias 24v and 24g for the power and ground systems of the synchronous DRAM chip 20. Second, they are the first silicon through vias 14v and 14g of the microcomputer chip 10, which are coupled to the second silicon through vias 24v and 24g. Third, they are the external coupling electrodes 32v and 32g respectively coupled to the first silicon through vias 14v and 14g. Thus, the coupling between the power and ground paths to the synchronous DRAM chip 20 becomes strong.

(3) With those, it is possible to improve noise immunity to the power supplies and ground of the synchronous DRAM chip 20 in the semiconductor device 1 in which the synchronous DRAM chip 20 is superimposed over the microcomputer chip 10 and mounted over one wiring board 30. This makes it possible to make external bypass capacitors unnecessary.

(4) Furthermore, in the synchronous DRAM chip 20, the second chip top surface electrodes 23, 23v and 23g and second chip bottom surface electrodes 22, 22v and 22g related to the power and ground systems are penetrated through by the second silicon through vias 24, 24v and 24g. It is therefore possible to improve noise immunity to the power supply and ground similarly even though the second semiconductor chips 20 are superimposed on each other in plural stages.

Second Embodiment

Figure 3:
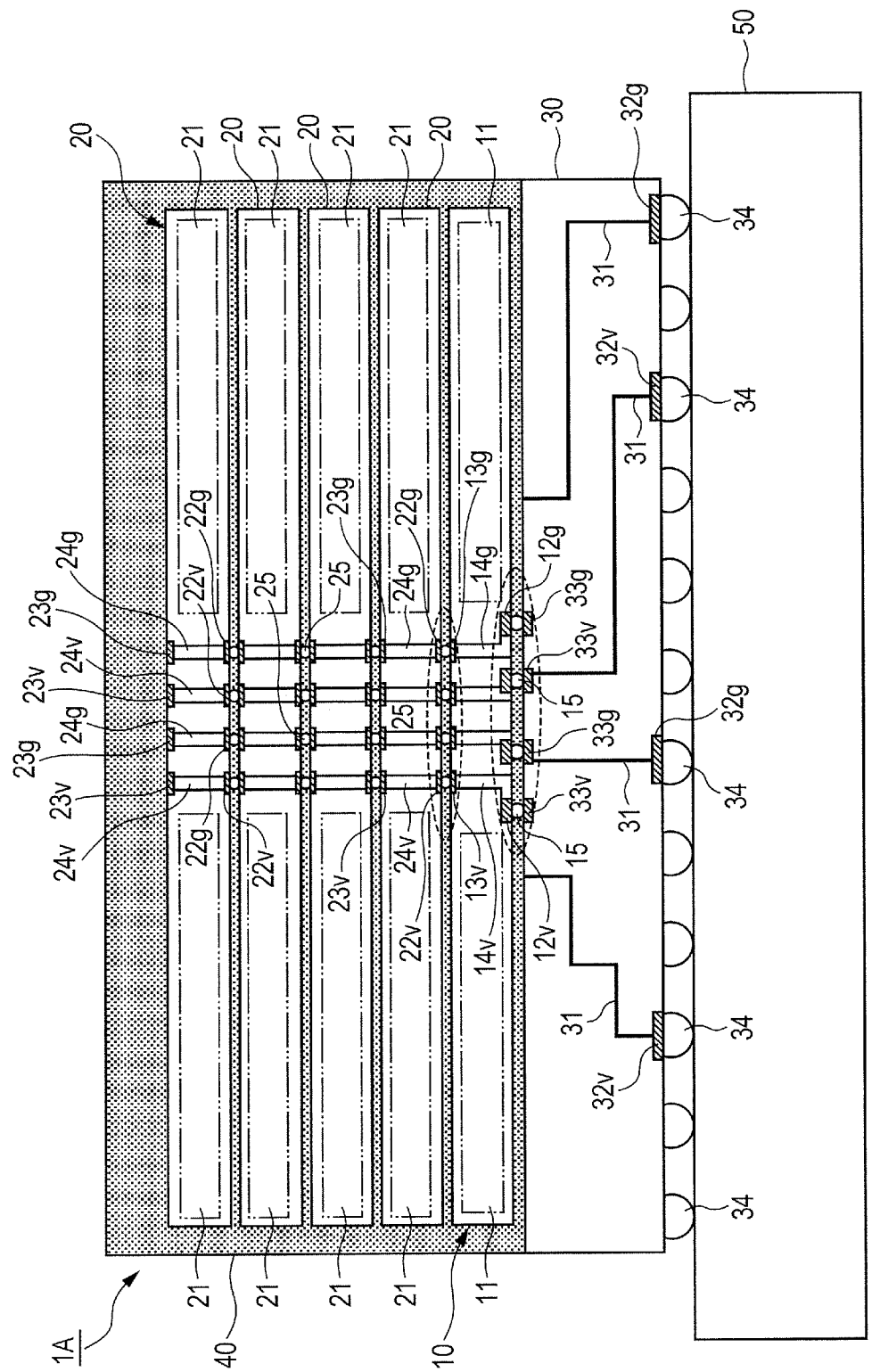
FIG. 3 is a sectional view illustrating a schematic vertical sectional structure of a semiconductor device according to a second embodiment.

A schematic vertical sectional structure of a semiconductor device according to a second embodiment is illustrated in FIG. 3. The semiconductor device 1A shown in the same figure is different from the semiconductor device 1 shown in FIG. 1 in that a plurality of synchronous DRAM chips 20 are mounted over a microcomputer chip 10. Here, a system board or a motherboard 50 with the semiconductor device 1A mounted thereon is also illustrated together. Conductive paths of the synchronous DRAM chips 20 are illustrated particularly in FIG. 3 with supply paths of power and ground systems to the synchronous DRAM chips 20 being principally shown. The same reference numerals are respectively attached to components having the same function as in FIGS. 1 and 2, and their detailed description will be omitted.

In FIG. 3, the synchronous DRAM chips 20 each illustrated as the second semiconductor chip are mounted in vertical piles in plural form over the microcomputer chip 10 illustrated as the first semiconductor chip. That is, in the structure of FIG. 1, each of the synchronous DRAM chips 20 of the same type is further stacked over the synchronous DRAM chip 20 and formed by being finally sealed with a resin 40. The coupling between the upper and lower synchronous DRAM chips 20 is performed by coupling second chip top surface electrodes 23, 23v and 23g and second chip bottom surface electrodes 22, 22v and 22g vertically opposite to one another through the use of micro bumps 25. Although not shown in the drawing, other prescribed second chip bottom surface electrodes 22 and second chip top surface electrodes 23 of each synchronous DRAM chip 20 are also coupled by second silicon through vias for each corresponding electrode. In particular, since there is provided a mounting configuration that electrodes related to the address, command and data systems are commonly coupled between the respective synchronous DRAM chips, for example, a decode result of plural bits included in a command is to be used as for chip enable of the synchronous DRAM chip 20. Other configurations such as the mounting of a plurality of synchronous DRAM chips 20 over the microcomputer chip 10 at its central part, etc. are as with FIG. 1, and their detailed description will therefore be omitted.

The semiconductor device 1A according to the second embodiment can utilize the upper part of the microcomputer chip 10 efficiently in the vertical direction. As described in the first embodiment, the second chip bottom surface electrodes 22v and 22g and second chip top surface electrodes 23v and 23g of the synchronous DRAM chip 20 are coupled by the second silicon through vias 24v and 24g for each corresponding electrode. Therefore, even if the synchronous DRAM chips 20 are superimposed on each other in plural stages, the effect of improving noise immunity to the power supply and ground is guaranteed. Although, not shown in the drawing, since other second chip bottom surface electrodes 22 and second chip top surface electrodes 23 of the synchronous DRAM chip 20 are also coupled by the second silicon through vias for each corresponding electrodes, it is guaranteed that the synchronous DRAM chips 20 can easily be mounted by laminating them via micro bumps 25. Thus, wire bonding may not be used.

Figure 4:
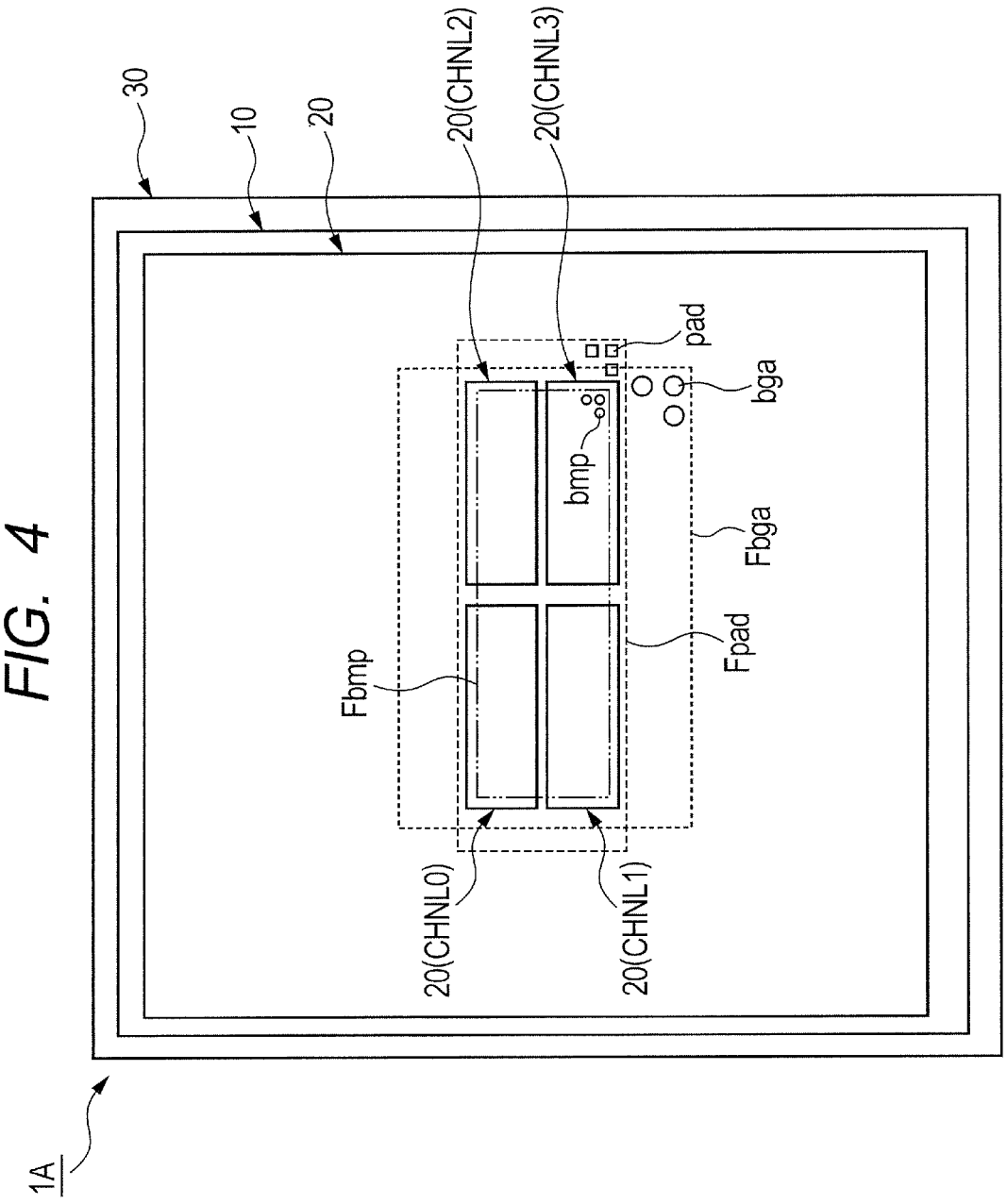
FIG. 4 is a plan view illustrating a schematic plan configuration of a semiconductor device according to the second embodiment.

A schematic plan view of a semiconductor device according to the second embodiment is illustrated in FIG. 4. The semiconductor device 1A shown in the same figure is configured by laminating and mounting four synchronous DRAM chips 20 over a microcomputer chip 10. A more detailed electrode arrangement or layout for the microcomputer chip 10 and the synchronous DRAM chips 20 will be shown by way of example here. Here, a microcomputer chip 10 that is approximately square is mounted over an approximately square wiring board 30 as a first semiconductor chip. Synchronous DRAM chips 20, each of which has a chip area nearly equal to that of the first semiconductor chip and is placed in the upper midsection thereof and which is of a second semiconductor chip, are laminated over the microcomputer chip 10 and mounted thereon as four. They are sealed with a resin in their entirety.

Here, in FIG. 4, bmp indicate for convenience, even electrodes for coupling the microcomputer chip 10 and the synchronous DRAM chips 20 and electrodes (also simply described as inter-chip electrodes) of any of bumps coupled thereto. Here, the electrodes are, for example, the electrodes 22, 22v and 22g in the synchronous DRAM chip 20 of FIG. 1 and the electrodes 13, 13v and 13g in the microcomputer chip 10 of FIG. 1. The bumps are the micro bumps 25 of FIG. 1, for example. Pad indicate, for convenience, even the electrodes (mounting electrodes 33, 33v and 33g formed in the surface of the wiring board 30 of FIG. 1 and the electrodes 12, 12v and 12g formed at the bottom surface of the microcomputer chip 10 of FIG. 1) for coupling the wiring board 30 and the microcomputer chip 10, and electrodes (also simply described as chip mounting electrodes) of any of bumps (micro bumps 15 of FIG. 1) coupled thereto. Bga indicate, for convenience, even electrodes (external coupling electrodes 32v and 32g of FIG. 1) of power and ground systems or the like related to each synchronous DRAM chip 20, of electrodes formed in an array fashion at the bottom surface of the wiring board 30, and electrodes (also simply described as DRAM-related mounting electrodes) of any of bumps (solder balls 34 of FIG. 1) coupled thereto.

In FIG. 4, Fbmp means an area for the layout of the inter-chip electrodes bmp when the semiconductor device 1A is seen as in the plane, and Fpad means an area for the layout of the chip mounting electrodes pad when the semiconductor device 1A is seen in the plane. Fbga means the DRAM-related mounting electrodes bga when the semiconductor device 1A is seen in the plane. Although not shown in the drawing in particular, a lot of solder balls coupled only to the microcomputer chip 10 are disposed around the DRAM-related mounting electrode bga at the bottom surface of the wiring board 30. They form an array-like placement in their entirety. The inter-chip electrodes bmp at the surface of the microcomputer chip 10 have been prepared as mounting channels CHNL0 through CHNL3 specific to the electrodes of the synchronous DRAM chips 20 respectively.

Figure 5:
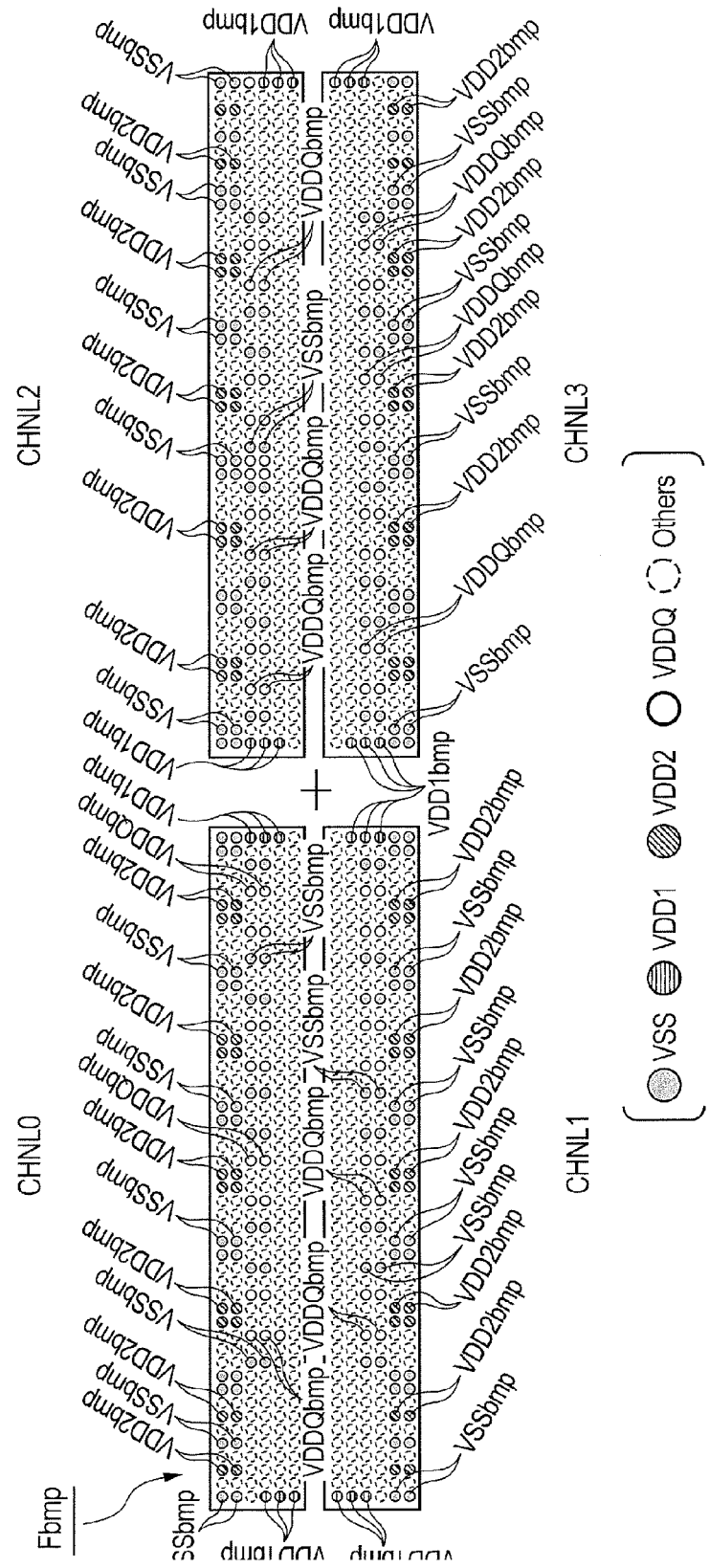
FIG. 5 is an explanatory diagram illustrating mounting channels CHNL0 through CHNL3 of a synchronous DRAM at the surface of a microcomputer chip and the layout of inter-chip electrodes bmp at the mounting channels CHNL0 through CHNL3.
Figure 6:
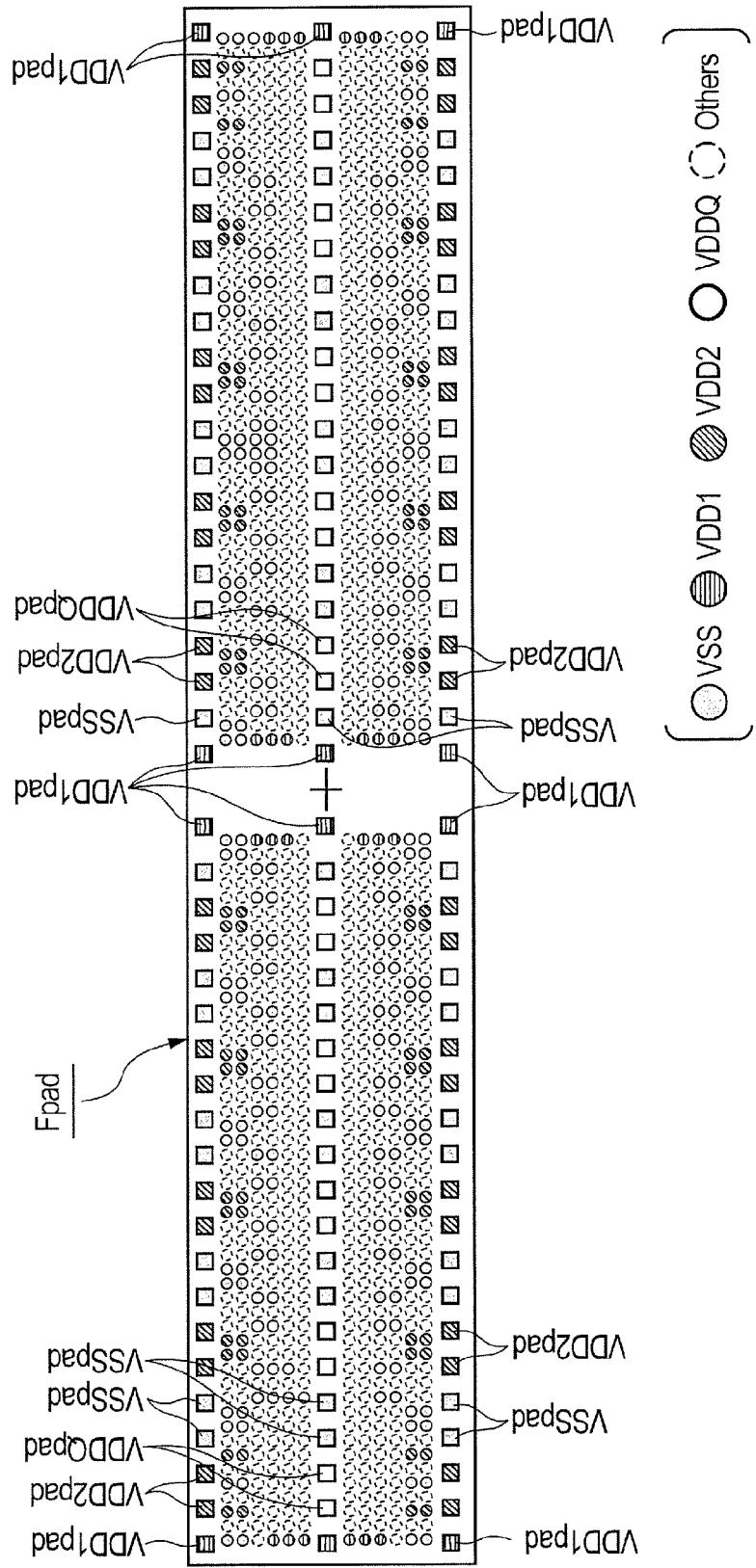
FIG. 6 is an explanatory diagram illustrating the layout of chip mounting electrodes pad placed in a layout area Fpad at the bottom surface of the microcomputer chip along with the layout of the inter-chip electrodes bmp of FIG. 4.
Figure 7:
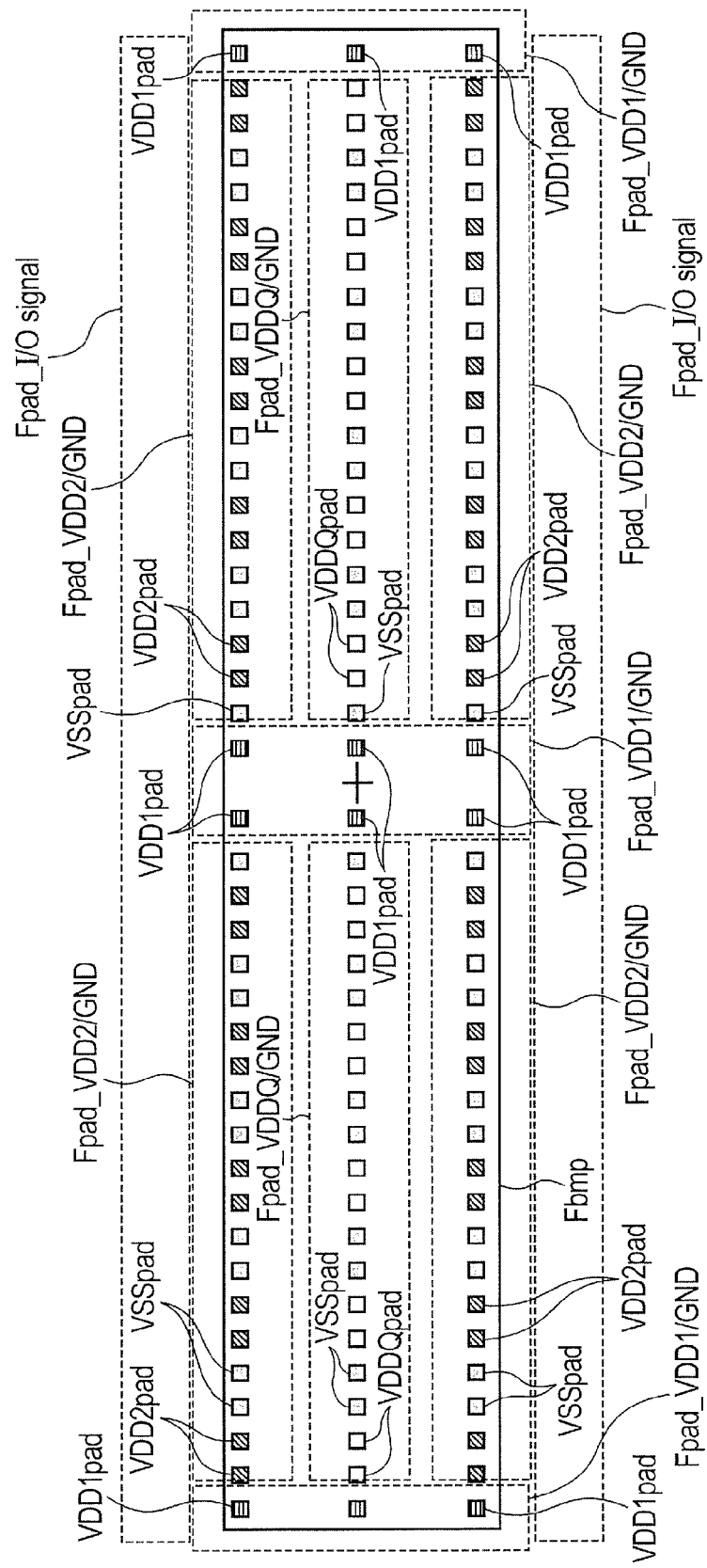
FIG. 7 is an explanatory diagram showing the layout area Fpad at the bottom surface of the microcomputer chip in a classified form functionally.
Figure 8:
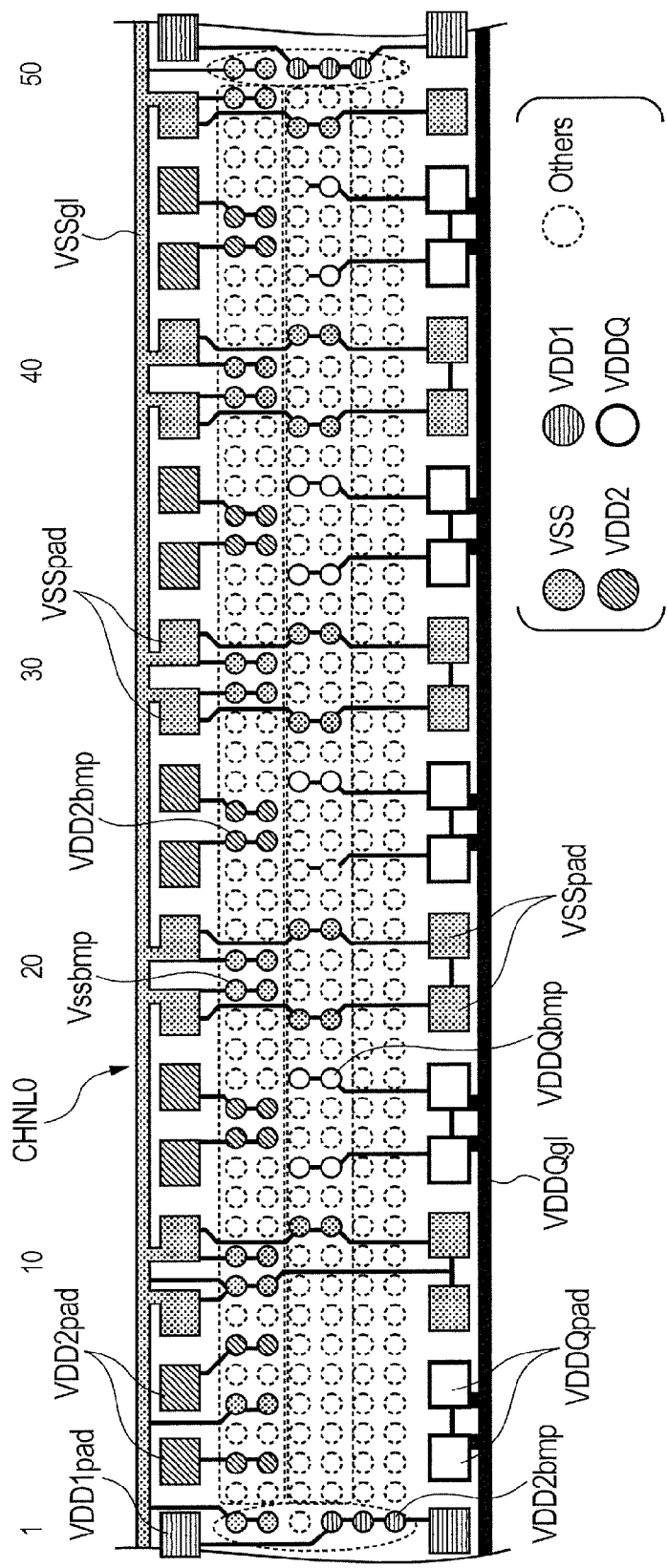
FIG. 8 is an explanatory diagram illustrating the configuration of coupling of chip mounting electrodes pad and their corresponding inter-chip electrodes bmp at one mounting channel CHNL0.

The mounting channels CHNL0 through CHNL3 of the synchronous DRAM 20 at the surface of the microcomputer chip 10 and the layout of the inter-chip electrodes bmp at the mounting channels CHNL0 through CHNL3 are illustrated in FIG. 5. In FIG. 6, the layout of the chip mounting electrodes pad placed in the layout area Fpad at the bottom surface of the microcomputer chip 10 is illustrated along with the layout of the inter-chip electrodes bmp of FIG. 4. FIG. 7 is an explanatory diagram showing the layout area Fpad at the bottom surface of the microcomputer chip 10 in a classified form functionally. FIG. 8 illustrates the configuration of coupling from the inter-chip electrodes bmp of one mounting channel to the chip mounting electrodes pad at the bottom surface of the microcomputer chip 10.

As described in the first embodiment, the synchronous DRAM chip 20 has, as for each of second internal circuits 21, for example, a data input/output system circuit, a command/address system input circuit and other circuits. As illustrated in FIG. 5, the inter-chip electrodes bmp related to each synchronous DRAM chip 20 are roughly divided in the following manner. Data system power supply electrodes VDDQbmp and ground electrodes VSSbmp are assigned to supply power and ground to the data input/output system circuit. Command/address system power supply electrodes VDD2bmp and ground electrodes VSSbmp are assigned to supply power and ground to the command/address system input circuit. Other circuit system power supply electrodes VDD1bmp and ground electrodes VSSbmp are assigned to supply power and ground to the other circuits. The remaining inter-chip electrodes bmp are assigned to addresses, data, commands, clocks, strobe signals, tests and NC (others).

The command/address system power supply electrodes VDD2bmp and ground electrodes VSSbmp are arranged along one of the long sides on the outer peripheral sides of the synchronous DRAM chip 20. The data system power supply electrodes VDDQbmp and ground electrodes VSSbmp are arranged along the long sides close to the opposite sides being other sides, of the long sides of the mounting channels CHNL0 and CHNL1 and CHNL1 to CHNL3 of the synchronous DRAM chips 20 as compared with the command/address system power supply electrodes VDD2bmp and ground electrodes VSSbmp. The other circuit system power supply electrodes VDD1bmp and ground electrodes VSSbmp are arranged along the short sides at both ends of the long sides of the synchronous DRAM chips 20 (mounting channels CHNL0 to CHNL3).

As apparent from the layout of the inter-chip electrodes bmp of FIG. 5, the microcomputer chip 1 has electrode layout areas in such a manner that the four mounting channels CHNL0 through CHNL3 can be coupled to each other with the synchronous DRAM chips 20 being linearly symmetric in their longitudinal and transverse directions centering on CNTR with the same plane. In particular, the layout of the mounting channels CHNL0 through CHNL3 has the following relations. That is, it means a relationship in which the layout area of the data system power supply electrodes VDDQbmp and ground electrodes VSSbmp for supplying power and ground to the data input/output system circuit of each synchronous DRAM chip 20 is sandwiched by the layout areas of the command/address system power supply electrodes VDD2bmp and ground electrodes VSSbmp for supplying power and ground to the command/address system input circuit.

The layout of the chip mounting electrodes pad arranged in the layout area Fpad at the bottom surface of the microcomputer chip 10 is illustrated along with the layout of the inter-chip electrodes bmp of FIG. 4. As apparent from FIG. 6, the layout of the chip mounting electrodes pad is set to such a layout based on the layout of the inter-chip electrodes bmp. That is, the chip mounting electrodes pad disposed at the bottom surface of the microcomputer chip 10 are arranged in the following manner. Data system power supply electrodes VDDQpad respectively coupled to the data system power supply electrodes VDDQbmp for supplying power to the data input/output circuit of the synchronous DRAM chip 20 are arranged in the central part of the area Fpad along the longitudinal direction thereof. Command/address system power supply electrodes VDD2pad respectively coupled to the command/address system power supply electrodes VDD2bmp for supplying power to the command/address system input circuit are arranged along the longitudinal side of the area Fpad so as to interpose the data system power supply electrodes VDDQpad therebetween from both sides. Other circuit system power supply electrodes VDD1pad respectively coupled to the other circuit system power supply electrodes VDD1bmp for supplying power and ground to the other circuits are arranged along both short sides of the area Fpad. Ground electrodes VSSpad respectively coupled to the ground electrodes VSSbmp are arranged in a distributed manner in the respective electrode arrangements of the data system power supply electrodes VDDQpad, the command/address system power supply electrodes VDD2pad and the other circuit system power supply electrodes VDD1pad.

FIG. 7 is an explanatory diagram showing the layout area Fpad at the bottom surface of the microcomputer chip 10 in a classified form functionally.

In FIG. 7, Fpad_VDDQ/GND means the layout area of the data system power supply electrodes VDDQpad and the ground electrodes VSSpad. Fpad_VDD2/GND means the layout area of the command/address system power supply electrodes VDD2pad and the ground electrodes VSSpad. Fpad_VDD1/GND means the layout area of the other circuit system power supply electrodes VDD1pad and the ground electrodes VSSpad. Fpad_I/O signal means the layout area of each signal and clock system electrodes of the chip mounting electrodes of the synchronous DRAM chips 20. This is coupled to the inter-chip electrodes bmp assigned to the address, data, clock and strobe signals (others).

The configuration of coupling of chip mounting electrodes pad and their corresponding inter-chip electrodes bmp at one mounting channel CHNL0 is illustrated in FIG. 8. Fbmp VDDQ/GND indicates an area to which the data system power supply electrodes VDDQbmp and ground electrodes VSSbmp are assigned. FbmpVDD2/GND indicates an area to which the command/address system power supply electrodes VDD2bmp and ground electrodes VSSbmp are assigned. FbmpVDD1/GND indicates an area to which the other circuit system power supply electrodes VDD1bmp and ground electrodes VSSbmp are assigned. A ground mainline VSSgl commonly coupled to the ground electrodes VSSpad and VSSbmp is placed adjacent to the command/address system power supply electrodes VDD2pad and ground electrodes VSSpad extending along the longitudinal direction of the mounting channel CHNL0. A data system power supply mainline VDDQgl commonly coupled to the data system power supply electrodes VDDQpad is placed adjacent to the data system power supply electrodes VDDQpad and ground electrodes VSSpad extending along the longitudinal direction of the mounting channel CHNL0. Although not shown in the figure in particular, other mounting channels CHNL1, CHNL2 and CHNL3 are also configured in like manner.

Figure 9:
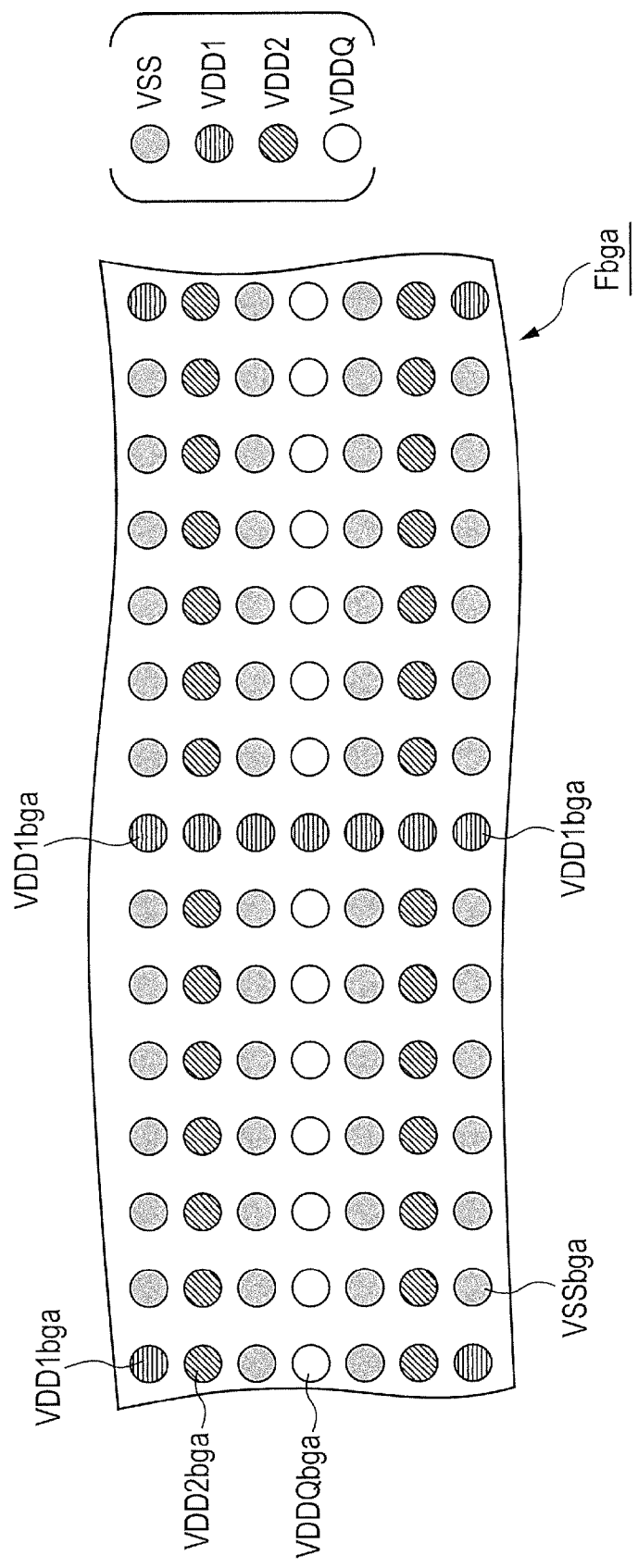
FIG. 9 is an explanatory diagram illustrating a first layout configuration of DRAM-related mounting electrodes like solder balls formed in an array fashion at the bottom surface of a wiring board.

A first layout configuration of DRAM-related mounting electrodes bga like solder balls formed in an array fashion at the bottom surface of the wiring board 30 is partly illustrated in FIG. 9. Basically, data system power supply electrodes VDDQbga are sandwiched by command/address system power supply electrodes VDD2bga from both sides along the longitudinal direction of the area Fbga. Other circuit system power supply electrodes VDD1bga are arranged at both ends of the area Fbg as viewed in its longitudinal direction. In FIG. 9 in particular, ground electrodes VSSbga are placed in alternate rows along the longitudinal direction of the area Fbga. A row of the ground electrodes VSSbga is interposed adjacent to the respective electrode rows of the data system power supply electrodes VDDQbga and command/address system power supply electrodes VDD2*bga*.

Figure 10:
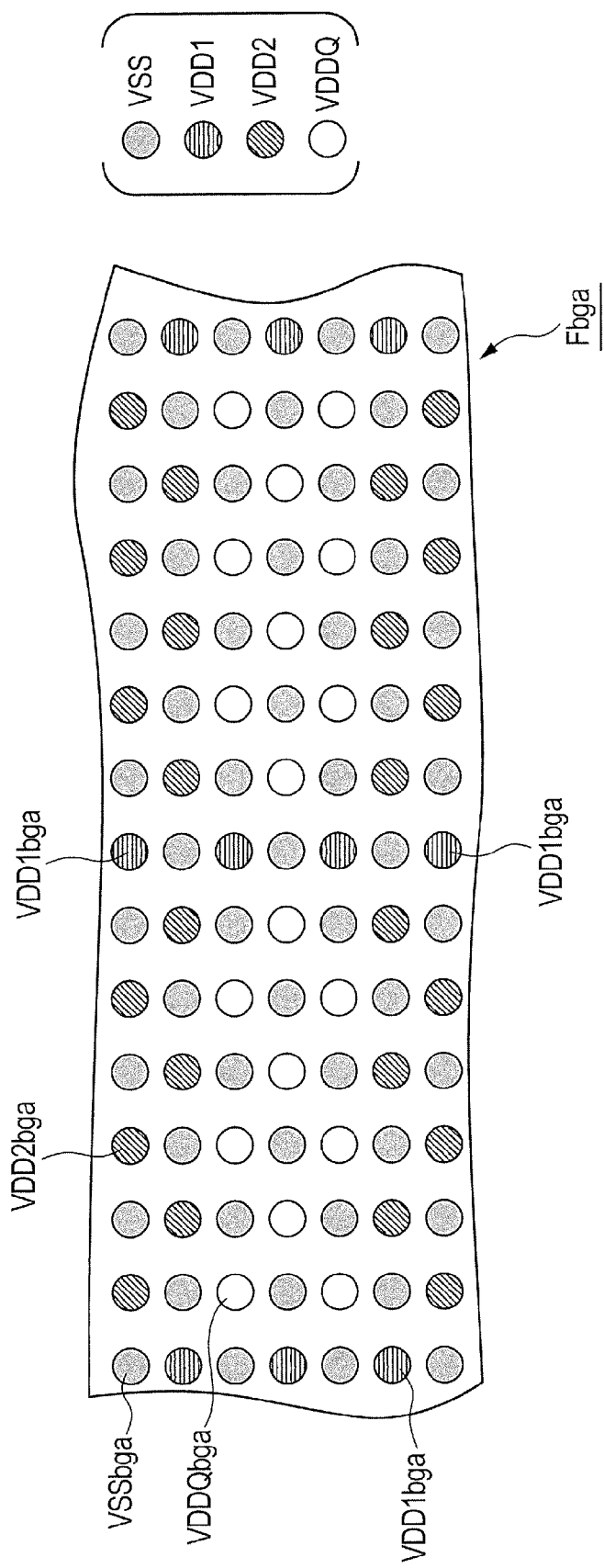
FIG. 10 is an explanatory diagram illustrating a second layout configuration of DRAM-related mounting electrodes like solder balls formed in an array fashion at the bottom surface of the wiring board.

A second layout configuration of DRAM-related mounting electrodes like solder balls formed in an array fashion at the bottom surface of the wiring board 30 is partly illustrated in FIG. 10. The second layout configuration is also the same as FIG. 9 in basic configuration in that data system power supply electrodes VDDQbga are sandwiched by command/address system power supply electrodes VDD2*bga* from both sides along the longitudinal direction of the area Fbga, and other circuit system power supply electrodes VDD1*bga* are arranged at both ends of the area Fbga as viewed in its longitudinal direction. A point of difference between the two resides in that ground electrodes VSSbga are arranged in zigzag form in the area Fbga.

Figure 11:
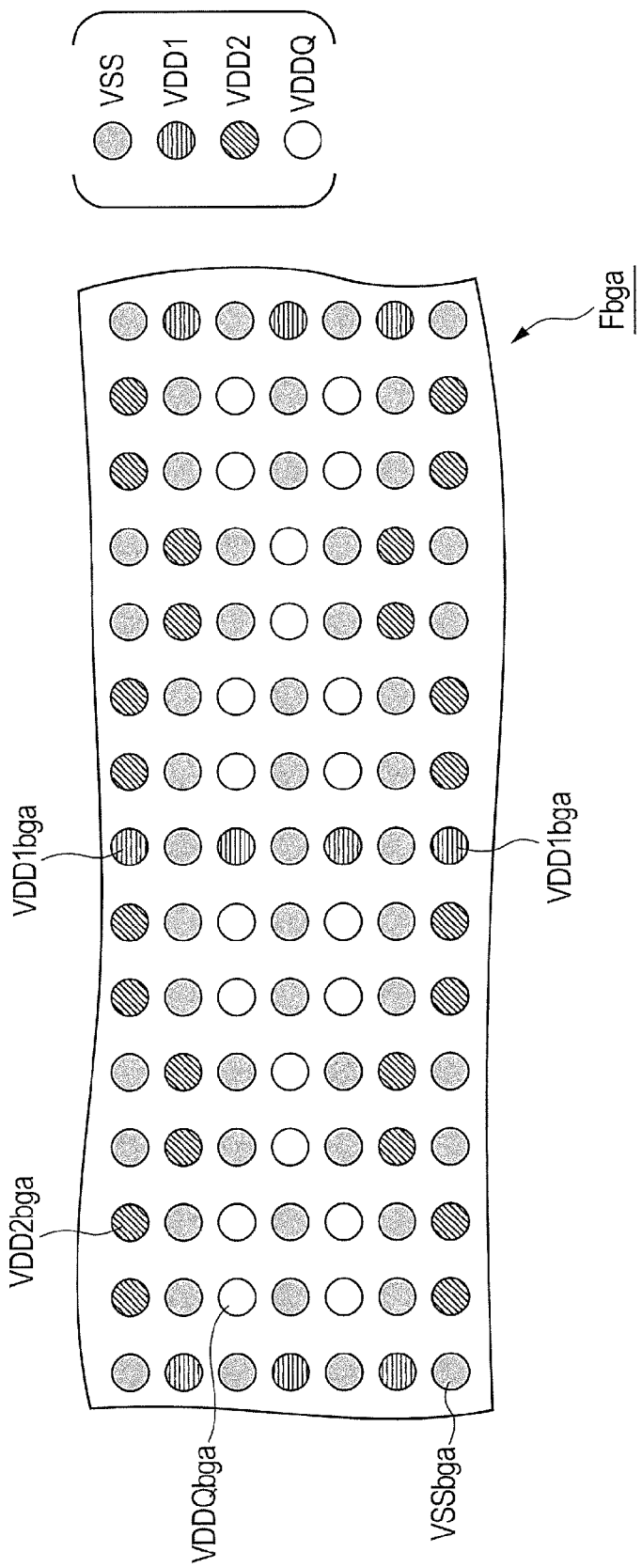
FIG. 11 is an explanatory diagram illustrating a third layout configuration of DRAM-related mounting electrodes like solder balls formed in an array fashion at the bottom surface of the wiring board.

A third layout configuration of DRAM-related mounting electrodes like solder balls formed in an array fashion at the bottom surface of the wiring board 30 is partly illustrated in FIG. 11. Although the third layout configuration is also similar to the above in basic configuration, the principal layout of ground electrodes VSSbga differs. Pairs in each of which the two ground electrodes VSSbga are arranged side by side are arranged in a distributed manner.

Figure 12:
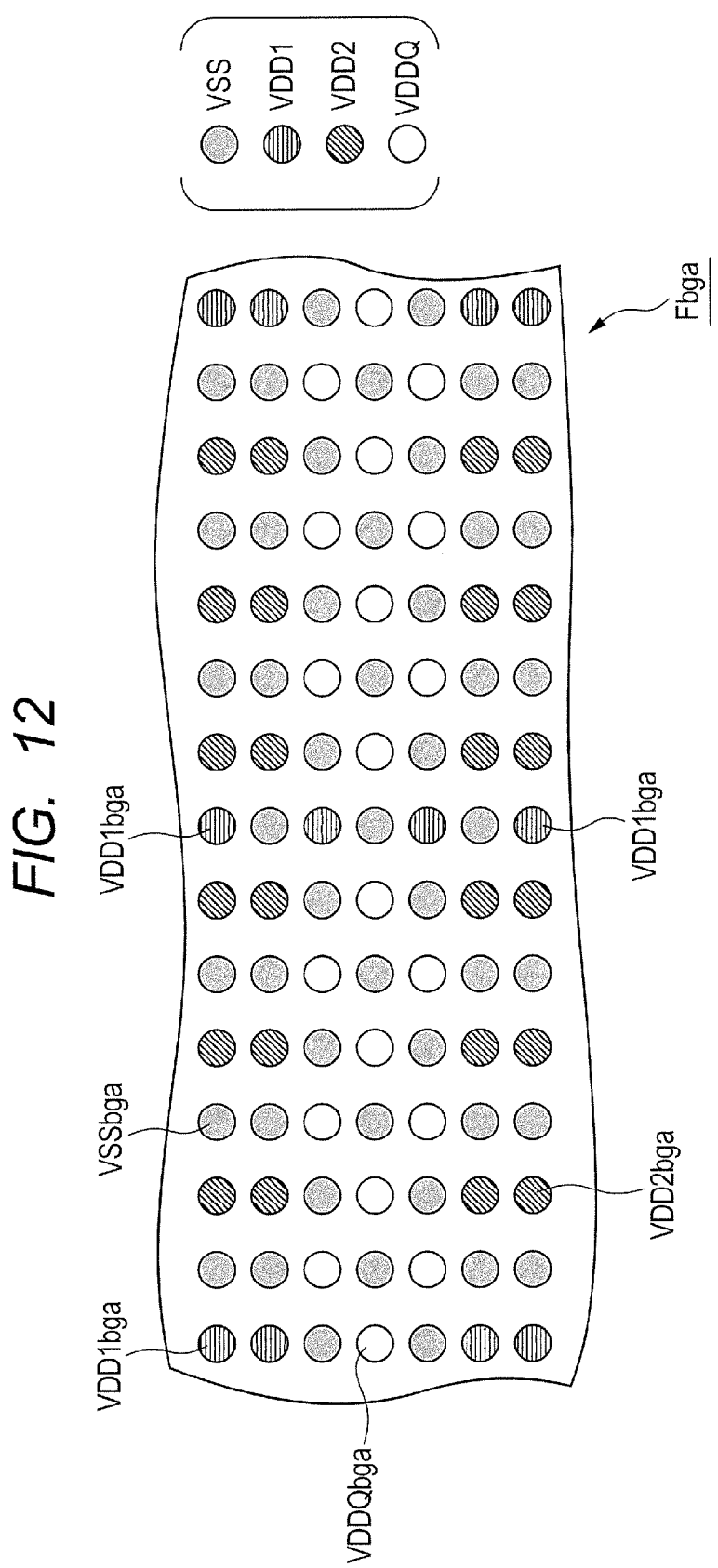
FIG. 12 is an explanatory diagram illustrating a fourth layout configuration of DRAM-related mounting electrodes like solder balls formed in an array fashion at the bottom surface of the wiring board.

A fourth layout configuration of DRAM-related mounting electrodes like solder balls formed in an array fashion at the bottom surface of the wiring board 30 is partly illustrated in FIG. 12. Although the fourth layout configuration is also similar to the above in basic configuration, the principal layout of ground electrodes VSSbga differs. Pairs in each of which the two ground electrodes VSSbga are arranged side by side are arranged in a distributed manner.

According to the second embodiment, the following operative effects are brought about.

(1) The second embodiment is also similar to the above. That is, the inter-chip electrodes VDDQbmp, VDD1*bmp*, VDD2*bmp* and VSSbmp for the power and ground systems of the synchronous DRAM chips 20 are led to their corresponding DRAM-related mounting electrodes VDDQbga, VDD1*bga*, VDD2*bga* and VSSbga formed in the central part of the wiring board 30 through the silicon through vias (corresponding to 14*v* and 14*g*) formed in the central part of the microcomputer chip 10. Thus, the wiring paths for the power and ground systems of the synchronous DRAM chip 20 lying inside the semiconductor device 1A can be made conducive to low impedance of the power and ground systems of the synchronous DRAM chip 20 without the need for routing of them to the outer peripheral portion of the wiring board 30.

(2) Further, the power and ground systems are arranged so as to pair up with each other in a required combination based on one unit or plural units and configured in such a manner that the capacitive coupling and the inductive coupling become large. That is, firstly, there are provided the second silicon through vias (corresponding to 24*v* and 24*g*) for the power and ground systems of the synchronous DRAM chip 20. Secondly, there are provided the first silicon through vias (corresponding to 14*v* and 14*g*) of the microcomputer chip 10, which are respectively coupled to the second silicon through vias. Thirdly, there are provided the DRAM-related mounting electrodes VDDQbga, VDDbga, VDD2*bga* and VSSbga of the wiring board 30, which are respectively coupled to the first silicon through vias. Accordingly, the coupling between the power and ground paths to each synchronous DRAM chip 20 becomes strong.

(3) They enable an improvement in the noise impunity to the power supplies and grounds of the synchronous DRAM chips 20 in the semiconductor device 1A in which the synchronous DRAM chips 20 are laminated over the microcomputer chip 10 and mounted over one wiring board 30. This makes it possible to eliminate the need for external bypass capacitors.

(4) The synchronous DRAM chips 20 are laminated on each other and disposed in multiple stages to couple their corresponding inter-chip electrodes. Thus, the multiple synchronous DRAM chips 20 can be mounted by efficiently utilizing both of the surface of the microcomputer chip 10 and its vertical space while maintaining satisfactory noise immunity to the power supplies and grounds of the synchronous DRAM chips 20.

(5) Since the electrodes of the power and ground systems are placed in the data input/output system circuit, the command/address system input circuit and other circuits of the synchronous DRAM chip 20 in a roughly divided form, it is possible to improve noise immunity to the power supply and ground in roughly-divided circuit units.

(6) As illustrated in FIGS. 5 through 7, the microcomputer chip 10 has the channel regions CHNL0 through CHNL3 as the four electrodes areas in the line-symmetric array thereof with respect to the longitudinal and transverse directions within the same plane. The four channel regions CHNL0 through CHNL3 have relationships in which the layout areas of the data system power supply electrodes VDDQbmp and ground electrodes VSSbmp of the synchronous DRAM chips 20 are inter-regions for the respective channels as viewed in their longitudinal directions and respectively sandwiched by the layout areas of the command/address system power supply electrodes VDD2*bmp* and ground electrodes VSSbmp. It is thus possible to further improve noise immunity to the power supply and ground of the data input/output system circuit.

(7) Even if the synchronous DRAM chip 20 is one large in the number of input/output data bits like 512 bits as data input/output system electrodes, for example, it is possible to prevent malfunctions due to noise of the power and ground systems. Since the synchronous DRAM chip 20 in which the power and ground system noise have been suppressed is utilized as a data storage area, the microcomputer chip 10 can contribute to an improvement in reliability with respect to the data processing operation of a microcomputer.

The present invention is not limited to the embodiments referred to above. It is needless to say that various changes can be made thereto within the scope not departing from the gist thereof.

For example, the number of synchronous DRAM chips laminated and mounted over a microcomputer chip is not limited to one or four, but may be changed as appropriate. The number of stages to be mounted is not limited to one or four either, but may be changed as appropriate.

When a sheet of second semiconductor chip is mounted over a first semiconductor chip without being vertically laminated thereon, a second semiconductor chip with no adoption of a TSV structure may be used. For example, a synchronous DRAM chip may be used in which power and ground system electrodes of a synchronous DRAM are provided only at the bottom surface of a chip. Even in this case, as with the above embodiment, second chip bottom surface electrodes of power and ground systems of a second semiconductor chip are led to their corresponding external coupling electrodes formed in the central part of a wiring board through first silicon vias formed in the central part of the first semiconductor chip. Accordingly, wiring paths for the power and ground systems of the second semiconductor chip lying inside a semiconductor device can be made conducive to low impedance of the power and ground systems of the second semiconductor chip without the need for routing of the wiring paths to the outer peripheral portion of the wiring board. Further, the electrodes for the power and ground systems of the second semiconductor chip, the first silicon through vias of the first semiconductor, which are coupled to the corresponding electrodes, and the external coupling electrodes of the wiring board, which are coupled to the first silicon through vias, are arranged discretely from each other between the power and ground systems. Thus, the coupling between the power supply and ground to the second semiconductor chip becomes strong. With those, it is possible to improve noise immunity to the power supply and ground of the second semiconductor chip in the semiconductor device in which the second semiconductor chip is laminated over the first semiconductor chip and mounted over one wiring board. This enables elimination of the need for external bypass capacitors.

Even when the semiconductor device is configured using the second semiconductor chips free of the adoption of the above TSV structure, the technical contents described in the second embodiment can be applied as they are.

The first semiconductor chip is not limited to the microcomputer chip, but may be a semiconductor device of a system on-chip (SoC) configuration that performs data processing such as image processing or cipher processing, or may further be a semiconductor chip having another function. The second semiconductor chip is not limited to the synchronous DRAM chip, but may be a memory chip of another storage type such as a SRAM or may further be another semiconductor chip other than the memory chip coupled to the first semiconductor chip.

The semiconductor device may be equipped with a further semiconductor chip together with the first and second semiconductor chips.

In the present specification, the electrodes of the power and ground systems, which are coupled through the second silicon through vias, have been described by being classified into three types. That is, the first type includes data system power supply and ground electrodes (VDDQbmp and VSSbmp) for supplying power and ground to the data input/output system circuit. The second type includes command/address system power supply and ground electrodes (VDD2*bmp* and VSSbmp) for supplying power and ground to the command/ address system input circuit. The third type includes other circuit system power supply and ground electrodes (VDD1*bmp* and VSSbmp) for supplying power and ground to other circuits. The ground system electrodes are shared with a data system, an address command system, and others without individualizing reference numerals. To sum up, the ground system electrode may be shared with a data system, an address command system and others without distinction in particular. Further, if stated additionally, consideration may generally be given to the electrodes being brought into common usage.

The bottom surface electrodes, through vias and external coupling electrodes for the power and ground systems are respectively arranged in such a manner as to pair up in a required combination based on one unit of power and ground systems or plural units thereof. This form is not limited to those described in the embodiments, but can be modified as appropriate. The power supplies and grounds may be arranged in regular zigzag form.

The top surface of the chip placed in the top position, of the second semiconductor chips 20 may be hidden within the chip without exposing its electrodes. This is because there is no need to expose the same.

What is claimed is:
1. A semiconductor device comprising:
a wiring board;
a first semiconductor chip mounted over the wiring board; and
a second semiconductor chip mounted in a central part located over the first semiconductor chip,
wherein the wiring board includes:
a plurality of external coupling electrodes disposed in an array form at a bottom surface of the wiring board;
a plurality of substrate electrodes disposed in an array form at a top surface of the wiring board in pitches smaller than those of the external coupling electrodes; and
in-substrate wirings for coupling the external coupling electrodes and the substrate electrodes to one another respectively,
wherein the first semiconductor chip includes:
first internal circuits integrated by a semiconductor integrated circuit technology;
a plurality of first chip bottom surface electrodes which are coupled to their corresponding substrate electrodes and coupled to required circuit nodes of the first internal circuits respectively and which are disposed in an array form at a bottom surface of the first semiconductor chip; and
a plurality of first chip top surface electrodes coupled to the required circuit nodes of the first internal circuits respectively and disposed in an array form at a top surface of the first semiconductor chip,
wherein the second semiconductor chip includes:
second internal circuits integrated by a semiconductor integrated circuit technology;
a plurality of second chip bottom surface electrodes which are coupled to their corresponding first chip top surface electrodes and coupled to required circuit nodes of the second internal circuits respectively and which are arranged in an array form at a bottom surface of the second semiconductor chip; and
a plurality of second chip top surface electrodes coupled to the required circuit nodes of the second internal circuits respectively and arranged in an array form at a top surface of the second semiconductor chip,
wherein the corresponding electrodes for signals and power and ground systems in the second chip bottom surface electrodes and the second chip top surface electrodes are coupled through second silicon through vias, and the second silicon through vias for the power system and the second silicon through vias for the ground system are arranged so as to pair up with each other in a required combination based on one unit or plural units,
wherein the power and ground system electrodes coupled to the second silicon through vias are gathered in the central part of the first semiconductor chip within the first chip bottom surface electrodes and the first chip top surface electrodes, the first chip bottom surface electrodes of the power and ground systems gathered in the central part and the first chip top surface electrodes corresponding to the first chip bottom surface electrodes are coupled through first silicon through vias, and the power system first silicon through vias and the ground system first silicon through vias are arranged so as to pair up with each other in a required combination based on one unit or plural units, and
wherein the electrodes related to the power and ground systems, which are coupled to the first silicon through vias, are gathered in the central part of the wiring board within the external coupling electrodes and the substrate electrodes, and the power system electrodes and the ground system electrodes gathered in the central part are arranged so as to pair up with each other in a required combination based on one unit or plural units.

2. The semiconductor device according to claim 1,
wherein the second semiconductor chip is arranged to be laminated in plural stages, and
wherein the second chip top surface electrodes in the laminated lower second semiconductor chip, and the second chip bottom surface electrodes in the laminated upper second semiconductor chip are respectively coupled to one another.

3. The semiconductor device according to claim 1,
wherein the second semiconductor chip has an elongated electrode layout area,
wherein the second internal circuit has a data input/output system circuit, a command/address system input circuit and other circuits,
wherein the electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits,
wherein the data system power and ground electrodes are arranged along one of the long sides of the electrode layout area,
wherein the command/address system power and ground electrodes are arranged along the other of the long sides of the electrode layout area, and
wherein the other circuit system power and ground electrodes are arranged along the short sides at both ends of the long sides of the electrode layout area.

4. The semiconductor device according to claim 3,
wherein the first semiconductor chip has four sets of the first chip top surface electrodes in such a manner that four electrode layout areas are couplable in matrix form within the same plane in a line symmetric array with respect to longitudinal and transverse directions thereof, and
wherein the four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

5. The semiconductor device according to claim 4, wherein the second semiconductor chip is a synchronous DRAM having data input/output terminals of 512 bits as the data input/output system electrodes in the second chip bottom surface electrodes and the second chip top surface electrodes.

6. The semiconductor device according to claim 5, wherein the first semiconductor chip is a microcomputer including a central processing unit and a memory controller which performs memory interface control on the synchronous DRAM.

7. A semiconductor device comprising:
a wiring board;
a first semiconductor chip mounted over the wiring board; and
a second semiconductor chip mounted in a central part located over the first semiconductor chip,
wherein the wiring board includes:
a plurality of external coupling electrodes disposed in an array form at a bottom surface of the wiring board;
a plurality of substrate electrodes disposed in an array form at a top surface of the wiring board in pitches smaller than those of the external coupling electrodes; and
in-substrate wirings for coupling the external coupling electrodes and the substrate electrodes to one another respectively,
wherein the first semiconductor chip includes:
first internal circuits integrated by a semiconductor integrated circuit technology;
a plurality of first chip bottom surface electrodes which are coupled to their corresponding substrate electrodes and coupled to required circuit nodes of the first internal circuits respectively and which are disposed in an array form at a bottom surface of the first semiconductor chip; and
a plurality of first chip top surface electrodes coupled to the required circuit nodes of the first internal circuits respectively and disposed in an array form at a top surface of the first semiconductor chip,
wherein the second semiconductor chip includes:
second internal circuits integrated by a semiconductor integrated circuit technology;
a plurality of second chip bottom surface electrodes which are coupled to their corresponding first chip top surface electrodes and coupled to required circuit nodes of the second internal circuits respectively and which are arranged in an array form at a bottom surface of the second semiconductor chip; and
a plurality of second chip top surface electrodes coupled to the required circuit nodes of the second internal circuits respectively and arranged in an array form at a top surface of the second semiconductor chip,
wherein the corresponding electrodes for power and ground systems in the second chip bottom surface electrodes and the second chip top surface electrodes are coupled through second silicon through vias, and the power and ground system electrodes coupled through the second silicon through vias are arranged so as to pair up with each other in a required combination based on one unit or plural units,
wherein the power and ground system electrodes coupled to the second silicon through vias are gathered in the central part of the first semiconductor chip within the first chip bottom surface electrodes and the first chip top surface electrodes, the first chip bottom surface electrodes of the respective power and ground systems gathered in the central part and the first chip top surface electrodes corresponding to the first chip bottom surface electrodes are coupled through first silicon through vias, and the power system electrodes and the ground system electrodes respectively coupled through the first silicon through vias are arranged so as to pair up with each other in a required combination based on one unit or plural units, and
wherein the electrodes related to the power and ground systems, which are coupled to the first silicon through vias, are gathered in the central part of the wiring board within the external coupling electrodes and the substrate electrodes, and the power system electrodes and the ground system electrodes gathered in the central part are arranged so as to pair up with each other in a required combination based on one unit or plural units.

8. The semiconductor device according to claim 7,
wherein the second semiconductor chip is arranged to be laminated in plural stages, and
wherein the second chip top surface electrodes in the laminated lower second semiconductor chip, and the second chip bottom surface electrodes in the laminated upper second semiconductor chip are respectively coupled to one another.

9. The semiconductor device according to claim 7,
wherein the second semiconductor chip has an elongated electrode layout area,
wherein the second internal circuit has a data input/output system circuit, a command/address system input circuit and other circuits,
wherein the electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits,
wherein the data system power and ground electrodes are arranged along one of the long sides of the electrode layout area,
wherein the command/address system power and ground electrodes are arranged along the other of the long sides of the electrode layout area, and
wherein the other circuit system power and ground electrodes are arranged along the short sides at both ends of the long sides of the electrode layout area.

10. The semiconductor device according to claim 9,
wherein the first semiconductor chip has four sets of the first chip top surface electrodes in such a manner that four electrode layout areas are couplable in matrix form within the same plane in a line symmetric array with respect to longitudinal and transverse directions thereof, and
wherein the four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

11. The semiconductor device according to claim 10, wherein the second semiconductor chip is a synchronous DRAM having data input/output terminals of 512 bits as the data input/output system electrodes in the second chip bottom surface electrodes and the second chip top surface electrodes.

12. The semiconductor device according to claim 11, wherein the first semiconductor chip is a microcomputer including a central processing unit and a memory controller which performs memory interface control on the synchronous DRAM.

13. A semiconductor device comprising:
a wiring board;
a first semiconductor chip mounted over the wiring board; and
a second semiconductor chip mounted in a central part located over the first semiconductor chip,
wherein the wiring board includes:
a plurality of external coupling electrodes disposed in an array form at a bottom surface of the wiring board;
a plurality of substrate electrodes disposed in an array form at a top surface of the wiring board in pitches smaller than those of the external coupling electrodes; and
in-substrate wirings for coupling the external coupling electrodes and the substrate electrodes to one another respectively,
wherein the first semiconductor chip includes:
first internal circuits integrated by a semiconductor integrated circuit technology;
a plurality of first chip bottom surface electrodes which are coupled to their corresponding substrate electrodes and coupled to required circuit nodes of the first internal circuits respectively and which are disposed in an array form at a bottom surface of the first semiconductor chip; and
a plurality of first chip top surface electrodes coupled to the required circuit nodes of the first internal circuits respectively and disposed in an array form at a top surface of the first semiconductor chip,
wherein the second semiconductor chip includes:
second internal circuits integrated by a semiconductor integrated circuit technology; and
a plurality of second chip bottom surface electrodes which are coupled to their corresponding first chip top surface electrodes and coupled to required circuit nodes of the second internal circuits respectively and which are arranged in an array form at a bottom surface of the second semiconductor chip,
wherein the power and ground system electrodes in the second chip bottom surface electrodes are arranged so as to pair up with each other in a required combination based on one unit or plural units,
wherein the power and ground system electrodes coupled to the power and ground system second chip bottom surface electrodes are gathered in the central part of the first semiconductor chip within the first chip bottom surface electrodes and the first chip top surface electrodes, the first chip bottom surface electrodes of the power and ground systems gathered in the central part, and the first chip top surface electrodes corresponding to the first chip bottom surface electrodes are coupled through first silicon through vias, and the first silicon through vias for the power system and the first silicon through vias for the ground system are arranged so as to pair up with each other in a required combination based on one unit or plural units, and
wherein the electrodes related to the power and ground systems, which are coupled to the first silicon through vias, are gathered in the central part of the wiring board within the external coupling electrodes and the substrate electrodes, and the power system electrodes and the ground system electrodes gathered in the central part of the wiring board are arranged so as to pair up with each other in a required combination based on one unit or plural units.

14. The semiconductor device according to claim 13,
wherein the second semiconductor chip has an elongated electrode layout area,
wherein the second internal circuit has a data input/output system circuit, a command/address system input circuit and other circuits,
wherein the electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits, wherein the data system power and ground electrodes are arranged along one of the long sides of the electrode layout area, wherein the command/address system power and ground electrodes are arranged along the other of the long sides of the electrode layout area, and wherein the other circuit system power and ground electrodes are arranged along the short sides of the electrode layout area at both ends of the long sides of the electrode layout area.

15. The semiconductor device according to claim 14, wherein the first semiconductor chip has four sets of the first chip top surface electrodes in such a manner that four electrode layout areas are couplable in matrix form within the same plane in a line symmetric array with respect to longitudinal and transverse directions thereof, and wherein the four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

16. The semiconductor device according to claim 15, wherein the second semiconductor chip is a synchronous DRAM having data input/output terminals of 512 bits as the data input/output system electrodes in the second chip bottom surface electrodes and the second chip top surface electrodes.

17. The semiconductor device according to claim 16, wherein the first semiconductor chip is a microcomputer including a central processing unit and a memory controller which performs memory interface control on the synchronous DRAM.

18. A semiconductor device comprising:
a wiring board;
a first semiconductor chip mounted over the wiring board; and
a second semiconductor chip having a chip area smaller than the first semiconductor chip and mounted in a central part located over the first semiconductor chip,
wherein the wiring board includes:
a plurality of external coupling electrodes disposed in an array form at a bottom surface of the wiring board;
a plurality of substrate electrodes disposed in an array form at a top surface of the wiring board in pitches smaller than those of the external coupling electrodes; and
in-substrate wirings for coupling the external coupling electrodes and the substrate electrodes to one another respectively,
wherein the first semiconductor chip includes:
first internal circuits integrated by a semiconductor integrated circuit technology;
a plurality of first chip bottom surface electrodes which are coupled to their corresponding substrate electrodes and coupled to required circuit nodes of the first internal circuits respectively and which are disposed in an array form at a bottom surface of the first semiconductor chip; and
a plurality of first chip top surface electrodes coupled to the required circuit nodes of the first internal circuits respectively and disposed in an array form at a top surface of the first semiconductor chip, wherein the second semiconductor chip includes:
second internal circuits integrated by a semiconductor integrated circuit technology; and
a plurality of second chip bottom surface electrodes which are coupled to their corresponding first chip top surface electrodes and coupled to required circuit nodes of the second internal circuits respectively and which are arranged in an array form at a bottom surface of the second semiconductor chip,
wherein the power and ground system electrodes in the second chip bottom surface electrodes are arranged so as to pair up with each other in a required combination based on one unit or plural units,
wherein the power and ground system electrodes coupled to the power and ground system second chip bottom surface electrodes are gathered in the central part of the first semiconductor chip within the first chip bottom surface electrodes and the first chip top surface electrodes, the first chip bottom surface electrodes of the power and ground systems gathered in the central part, and the first chip top surface electrodes corresponding to the first chip bottom surface electrodes are coupled through first silicon through vias, and the power system electrodes and the ground system electrodes respectively coupled through the first silicon through vias are arranged so as to pair up with each other in a required combination based on one unit or plural units, and
wherein the electrodes coupled to the first silicon through vias are gathered in the central part of the wiring board within the external coupling electrodes and the substrate electrodes, and the power system electrodes and the ground system electrodes gathered in the central part are arranged so as to pair up with each other in a required combination based on one unit or plural units.

19. The semiconductor device according to claim 18,
wherein the second semiconductor chip has an elongated electrode layout area,
wherein the second internal circuit has a data input/output system circuit, a command/address system input circuit and other circuits, and
wherein the electrodes of the power and ground systems, which are coupled through the second silicon through vias, are classified into data system power and ground electrodes for supplying power and ground to the data input/output system circuit, command/address system power and ground electrodes for supplying power and ground to the command/address system input circuit, and other circuit system power and ground electrodes for supplying power and ground to the other circuits, the data system power and ground electrodes are arranged along one of the long sides of the electrode layout area, the command/address system power and ground electrodes are arranged along the other of the long sides of the electrode layout area, and the other circuit system power and ground electrodes are arranged along the short sides at both ends of the long sides of the electrode layout area.

20. The semiconductor device according to claim 19, wherein the first semiconductor chip has four sets of the first chip top surface electrodes in such a manner that four electrode layout areas are couplable in matrix form within the same plane in a line symmetric array with respect to longitudinal and transverse directions thereof, and the four sets of the first chip top surface electrodes have relationships in which the layout areas of the data system power and ground electrodes for supplying power and ground to the data input/output system circuit of the second semiconductor chip are respectively sandwiched by the layout areas of the data system power and ground electrodes for supplying power and ground to the command/address system input circuit.

* * * * *